US009711626B2

(12) United States Patent
Pfirsch et al.

(10) Patent No.: US 9,711,626 B2
(45) Date of Patent: Jul. 18, 2017

(54) REVERSE-CONDUCTING IGBT

(71) Applicant: Infineon Technologies AG, Neubiberg (DE)

(72) Inventors: Frank Dieter Pfirsch, Munich (DE); Dorothea Werber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/810,040

(22) Filed: Jul. 27, 2015

(65) Prior Publication Data

US 2016/0035867 A1 Feb. 4, 2016

(30) Foreign Application Priority Data

Jul. 29, 2014 (DE) ......................... 10 2014 110 681

(51) Int. Cl.
H01L 29/739 (2006.01)
H01L 27/06 (2006.01)
H01L 29/66 (2006.01)
H01L 27/07 (2006.01)

(52) U.S. Cl.
CPC ...... *H01L 29/7395* (2013.01); *H01L 27/0664* (2013.01); *H01L 27/0727* (2013.01); *H01L 29/66333* (2013.01); *H01L 27/0761* (2013.01)

(58) Field of Classification Search
CPC ............. H01L 29/7395; H01L 27/0664; H01L 29/66333
USPC .......................................................... 257/140
See application file for complete search history.

(56) References Cited

U.S. PATENT DOCUMENTS

| 2009/0085103 A1 | 4/2009 | Hille et al. | |
| 2012/0175674 A1* | 7/2012 | Shipley | H01L 29/7395 257/173 |
| 2012/0181575 A1* | 7/2012 | Pfirsch | H01L 29/0834 257/139 |

FOREIGN PATENT DOCUMENTS

| EP | 2003694 A2 | 12/2008 |
| EP | 2752875 A1 | 7/2014 |
| JP | H6177390 A | 6/1994 |
| JP | 2002134750 A | 5/2002 |
| JP | 2008530800 A | 8/2008 |

(Continued)

*Primary Examiner* — Fernando L Toledo
*Assistant Examiner* — Adam S Bowen
(74) *Attorney, Agent, or Firm* — Murphy, Bilak & Homiller, PLLC

(57) ABSTRACT

A reverse-conducting IGBT includes a semiconductor body having a drift region arranged between first and second surfaces. The semiconductor body further includes first collector regions arranged at the second surface and in Ohmic contact with a second electrode, backside emitter regions and in Ohmic contact with the second electrode. In a horizontal direction substantially parallel to the first surface, the first collector regions and backside emitter regions define an rc-IGBT area. The semiconductor body further includes a second collector region of the second conductivity type arranged at the second surface and in Ohmic contact with the second electrode. The second collector region defines in the horizontal direction a pilot-IGBT area. The rc-IGBT area includes first semiconductor regions in Ohmic contact with the first electrode and arranged between the drift region and first electrode. The pilot-IGBT area includes second semiconductor regions of the same conductivity type as the first semiconductor regions.

20 Claims, 16 Drawing Sheets

(56) References Cited

FOREIGN PATENT DOCUMENTS

| | | |
|---|---|---|
| JP | 2009141202 A | 6/2009 |
| JP | 2009267116 A | 11/2009 |
| JP | 2010067901 A | 3/2010 |
| JP | 2012069579 A | 4/2012 |
| JP | 2012151470 A | 8/2012 |
| JP | 2013021304 A | 1/2013 |
| JP | 2013026534 A | 2/2013 |

* cited by examiner

REVERSE-CONDUCTING IGBT

PRIORITY CLAIM

This application claims priority to German Patent Application No. 10 2014 110 681.4 filed on 29 Jul. 2014, the content of said application incorporated herein by reference in its entirety.

TECHNICAL FIELD

This specification refers to embodiments of reverse-conducting IGBTs, in particular to reverse-conducting power IGBTs.

BACKGROUND

Many functions of modern devices in automotive, consumer and industrial applications, such as converting electrical energy and driving an electric motor or an electric machine, rely on semiconductor devices. Insulated Gate Bipolar Transistors (IGBTs) have been used for various applications including but not limited to switches in power supplies and power converters.

The direction of current flow through IGBTs operating as switches or motor drivers may be different in different operating cycles. When the IGBT is forward biased, i.e. when the pn-body diode at the body-drain junction of the IGBT is reversely biased, the IGBT is effective as an electronic switch capable of switching on and off a current flowing in a forward direction between a collector and an emitter terminal (metallization) by applying a gate potential to an insulated gate electrode to capacitively controlling a transistor channel in the p-type body region. The IGBT is in a "transistor mode" as long as a unipolar electron current through the transistor channel is below a threshold beyond which a voltage drop across the pn junction formed between a p-type collector region (also referred to as p-type backside emitter region and backside hole-emitter region) and an n-type drift region (also referred to as base region) arranged between the collector region and the body region is sufficiently high such that the collector region starts injecting holes into the drift region and a bipolar current flows in an "IGBT mode". To allow low ohmic current flow through the IGBT in a "reverse mode" (also referred to as "reverse-conducting mode" or "diode mode"), in which the pn-body diode is forwardly biased, a structured collector region having portions of both doping types may be provided. The loss of the thereby monolithically integrated free-wheeling diode is, in reverse mode of the IGBT, mainly determined by the product of current flow and voltage drop across the body diode and the drift region. IGBTs with monolithically integrated free-wheeling diodes are also termed "reverse-conducting IGBTs" (rc-IGBTs). These semiconductor devices avoid inductances and capacitances associated with the required contacts and supply lines of external free-wheeling diodes.

Typically, improving the characteristics of one mode of multi-mode rc-IGBTs adversely affects another mode. It is desirable to improve the device characteristics of RC-IGBTs with less adverse impact on other device characteristics.

SUMMARY

According to an embodiment, a reverse-conducting IGBT is provided. The reverse-conducting IGBT includes a semiconductor body including a first surface, a second surface opposite to the first surface, and a drift region of a first conductivity type arranged between the first surface and the second surface. A first electrode is arranged on the first surface. A second electrode is arranged on the second surface. The reverse-conducting IGBT further includes a first IGBT-cell, a first diode-cell, a second IGBT-cell, and a second diode-cell. The first IGBT-cell includes a first body region arranged in the semiconductor body and forming a first pn-junction with the drift region. A number of p-type dopants per area in the first IGBT-cell between the first pn-junction and the first surface has a first value. The first diode-cell includes a first anode region arranged in the semiconductor body and forming a second pn-junction with the drift region. A number of p-type dopants per area in the first diode-cell between the second pn-junction and the first surface has a second value lower than the first value. The second IGBT-cell includes a second body region arranged in the semiconductor body and forming a third pn-junction with the drift region. A number of p-type dopants per area in the second IGBT-cell between the third pn-junction and the first surface has a third value higher than the second value. The second diode-cell includes a second anode region arranged in the semiconductor body and forming a fourth pn-junction with the drift region. A number of p-type dopants per area in the second diode-cell between the fourth pn-junction and the first surface has a fourth value higher than the second value. The semiconductor body further includes at the second surface a p-type first collector region, a p-type second collector region, and an n-type backside emitter region which are in Ohmic contact with the second electrode. In a projection onto the first surface the first collector region overlaps with at least one of the first IGBT-cell and the first diode-cell, the backside emitter region overlaps with at least one of the first IGBT-cell and the first diode-cell, and the second collector region overlaps with the second IGBT-cell and the second diode-cell.

According to an embodiment, a reverse-conducting IGBT is provided. The reverse-conducting IGBT includes a semiconductor body including a first surface, a second surface opposite to the first surface, and a drift region of a first conductivity type arranged between the first surface and the second surface. A first electrode is arranged on the first surface. A second electrode is arranged on the second surface. The semiconductor body further includes first collector regions of a second conductivity type arranged at the second surface and in Ohmic contact with the second electrode, backside emitter regions of the first conductivity type arranged at the second surface and in Ohmic contact with the second electrode, and a second collector region of the second conductivity type arranged at the second surface and in Ohmic contact with the second electrode. The first collector regions and the backside emitter regions define, in a horizontal direction substantially parallel to the first surface an rc-IGBT area. The second collector region defines in the horizontal direction a pilot-IGBT area. The rc-IGBT area includes first semiconductor regions of the second conductivity type in Ohmic contact with the first electrode and arranged between the drift region and the first electrode. The pilot-IGBT area includes second semiconductor regions of the second conductivity type in Ohmic contact with the first electrode and arranged between the drift region and the first electrode. A number of dopants of the second conductivity type per horizontal area of the first semiconductor regions is smaller than a number of dopants of the second conductivity type per horizontal area of the second semiconductor regions.

According to an embodiment, a method for forming a reverse-conducting IGBT is provided. The method includes providing a semiconductor body which has a first surface and includes a drift layer extending to the first surface, and forming a structured back-side emitter layer including p-type first collector regions arranged between the drift layer and a second surface semiconductor body opposite to the first surface, p-type first collector regions arranged between the second surface and the drift layer, n-type backside emitter regions in ohmic contact with the drift layer and arranged between the second surface and the drift layer, and a p-type second collector region arranged between the second surface and the drift layer. In a horizontal direction substantially parallel to the first surface, the first collector regions and the backside emitter regions define a first device area. The second collector region defines in the horizontal direction a second device area. First IGBT-cells are formed in the first device area and second IGBT-cells are formed in the second device area. Forming the first IGBT-cells and the second IGBT-cells includes introducing p-type dopants into the drift layer to form at least first body regions forming first pn-junctions with the drift layer in the first device area and to form at least second body regions forming second pn-junctions with the drift layer in the second device area. A first electrode is formed on the first surface and in ohmic contact with the first body regions and the second body regions. A second electrode is formed on the second surface and in ohmic contact with the backside emitter regions, the first collector regions and the second collector region. The method is performed so that more p-type dopants per area are present between the drift layer and the first surface in the second device area compared to the first device area.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
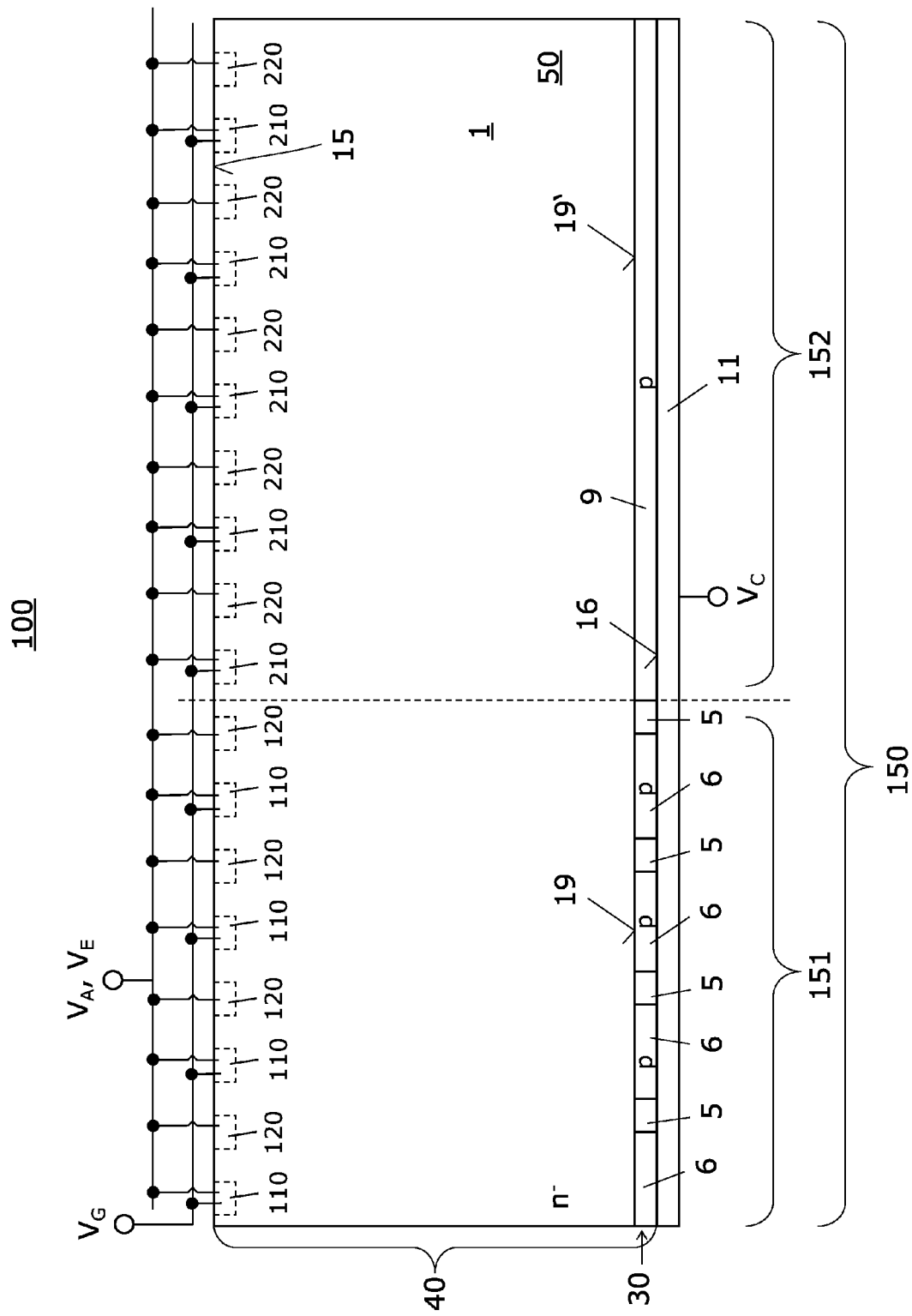
FIG. 1 schematically illustrates a vertical cross-section of a portion of a vertical semiconductor device according to one or more embodiments.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, monolithically integrated semiconductor devices having a reverse-conducting IGBT structure, in particular to power semiconductor devices such as reverse-conducting power IGBTs.

The term "power semiconductor device" as used in this specification intends to describe a semiconductor device on a single chip with high voltage and/or high current switching capabilities. In other words, power semiconductor devices are intended for high current, typically in the Ampere range, and/or high voltages, typically above 400 V, more typically above 600 V.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor devices or between different terminals of one or more devices or between a terminal or a metallization or an electrode and a portion or part of a semiconductor device.

FIG. 1 schematically illustrates an embodiment of a vertical reverse-conducting semiconductor device 100 such as an rc-IGBT or another semiconductor device including an rc-IGBT. The semiconductor device 100 includes a semiconductor body 40 having a first or main horizontal surface 15 and a second surface or back surface 16 arranged opposite the first surface 15. The normal direction of the first surface 15 is substantially parallel to the vertical direction (defines the vertical direction).

The semiconductor body 40 can be a single bulk monocrystalline material. The semiconductor body 40 can also include a bulk mono-crystalline material 30 and at least one epitaxial layer 50 formed thereon. Using epitaxial layers 50 provides more freedom in tailoring the background doping of the material since the doping concentration can be adjusted during deposition of the epitaxial layer or layers.

In the following, embodiments pertaining to semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-resistance Ron.

The semiconductor body 40 includes an n-type drift or base region 1 which is arranged between the back surface 16 and the main horizontal surface 15.

A minimum distance between the first and second surfaces 15, 16 depends on a voltage blocking capability the semiconductor device 100 is specified for. For example, the distance between the first and second surfaces 15, 16 may be in a range of 90 μm to 200 μm for a semiconductor device specified for a blocking voltage of about 1200 V. Other embodiments related to semiconductor devices with higher blocking capabilities may provide semiconductor bodies 40 with a thickness of several 100 μm. Semiconductor devices with lower blocking capabilities may have a vertical thickness from 35 μm to 90 μm.

In a plane parallel to the first surface 15 and when seen from above, respectively, the semiconductor body 40 may have a rectangular shape with an edge length in a range of up to several millimeters.

A first electrode or first metallization (not shown in FIG. 1) is arranged on the first surface 15, and a second electrode or second metallization 11 is arranged on the second surface 16.

The second electrode 11 typically forms a collector electrode and is in Ohmic contact with p-type first collector regions 6, a p-type second collector region 9 and n-type backside emitter regions 5 which are arranged at the second surface 16. The p-type first collector regions 6 and the p-type second collector region 9 may have the same maximum doping concentration.

In a horizontal direction parallel to the first surface 16, the first collector regions 5 and the backside emitter regions 6 may alternate with each other.

In the vertical cross-section and typically also when seen from above the first collector regions 6 and the backside emitter regions 5 define an rc-IGBT area 151 which is in the following also referred to as first device area 151 and first active device area 151, respectively, while the second collector region 9 defines a pilot-IGBT area 152 which is in the following also referred to as second device area 152 and second active device area 152, respectively. The pilot-IGBT area 152 may be defined in horizontal directions by corresponding maximum and minimum horizontal co-ordinates of the second collector region 9. Likewise, the rc-IGBT area 151 may be defined in horizontal directions by a minimum horizontal co-ordinate of a left outermost backside emitter region 5 and a maximum horizontal co-ordinate of a right outermost backside emitter region 5. A border between the rc-IGBT area 151 and an adjacent pilot-IGBT area 152 may be defined in the vertical cross-section by a horizontal position (horizontal co-ordinate) of an outermost backside emitter region 5 or a backside emitter region 5 which is closest to the second collector region 9, for example by a horizontal position of a pn-junction formed between the second collector region 9 and an adjoining backside emitter region 5 as illustrated in FIG. 1 or by a horizontal co-ordinate of the backside emitter region 5 which corresponds to a minimum distance to the second collector region 9. Alternatively, the border between the rc-IGBT area 151 and an adjacent pilot-IGBT area 152 may be defined in the vertical cross-section by a horizontal co-ordinate of the second collector region 9 which corresponds to a minimum distance to a backside emitter region 5. In FIG. 1 the given definitions result in the same border.

When seen from above and in a projection onto the first or second surface 15, 16 (or a plane parallel thereto), the border between the rc-IGBT area 151 and an adjacent pilot-IGBT area 152 may form a straight line or a closed curve depending on the layout of the semiconductor device 100. For example, each of the rc-IGBT area 151 and the pilot-IGBT area 152 may, in a projection onto the first and/or second surface 15, 16 be defined by one or more polygons.

When seen form above, the active device areas 151, 152 of semiconductor device 100 for carrying and/or controlling a load current are typically surrounded by a peripheral area (not shown in FIG. 1) which may include one or more edge-termination structures such as field-plates, floating p-type guard rings and the like.

The semiconductor body 40 further includes an n-type (common) drift region 1 arranged in the rc-IGBT area 151 and the pilot-IGBT area 152, between the first surface 15 and the collector regions 6, 9 and the backside emitter regions 5. The drift region 1 is in Ohmic contact with the collector electrode 11 via the backside emitter regions 5 of the rc-IGBT area 151. The drift region 1 may adjoin the collector regions 6, 9 and the backside emitter regions 5 or may be spaced apart from the collector regions 6, 9 and the backside emitter regions 5 by an n-type field-stop layer (not shown in FIG. 1) having a higher doping concentration than the drift region, for example a at least five times higher mean doping concentration.

Next to the first surface 15 transistor cells 110, 210 are formed which allow electrons to pass into the drift region 1 in a forward conducting mode including a transistor mode and an IGBT mode.

In the exemplary embodiment, the semiconductor body 100 further includes diode cells 120, 220, which may also be formed next to the first surface 15. The diode cells 120, 220 may inject holes into the drift region 1 in a reverse-conducting mode (diode mode) of the semiconductor device 100 and may thus be operable as integrated additional free-wheeling diodes. To reduce switching losses, it is often desirable to implement the integrated free-wheeling diodes as diodes with a low hole emitting efficiency to reduce any flooding of the drift region 1 with holes during the diode mode.

The transistor cells 110, 210, which are typically IGFET (insulated gate field effect transistor) cells, and the diode cells 120, 220 are explained in more detail below with regard to FIG. 3 to FIG. 14.

Typically, the semiconductor device 100 is a power semiconductor device having a plurality of transistor cells 110, 210, and a plurality of diode cells 120, 220. The semiconductor device 100 may even have several rc-IGBT areas 151 and several pilot-IGBT areas 152 that may alternate with each other in a horizontal direction.

As illustrated in FIG. 1, the transistor cells 110 and the diode cells 120 of the rc-IGBT area 151 may alternate with each other in the horizontal direction.

As illustrated in FIG. 1, the transistor cells 210 and the diode cells 220 of the pilot-IGBT area 152 may alternate with each other in the horizontal direction. In other embodiments, the inner part of the pilot-IGBT area 152 includes at least outside a border region next to the rc-IGBT area 151 only transistor cells 210. Note that the contribution of the diode cells 220 to the current in the diode mode decreases with the horizontal distance to the rc-IGBT area 151 and the closest backside emitter region 5, respectively.

For reasons of clarity, it is assumed in the detailed description of the figures that the semiconductor devices include n-channel transistor cells 110, 210. Equivalent considerations apply for devices which include p-channel transistor cells 110, 210 and thus have semiconductor regions with opposite doping types compared to the semiconductor devices with n-channel transistor cells 110, 210.

Typically, each transistor cell 110, 210 includes an n-type source region in ohmic contact with the first electrode, a p-type body region separating the source from the drift region 1, and a gate electrode electrically connected to a gate terminal The gate electrodes are capacitively coupled to the body regions through gate dielectrics. Subject to a voltage $V_G$ applied to the gate terminal an inversion channel formed in the body region of the respective transistor cell 110, 210 may allow an electron current through the transistor cell 110, 210 and towards the collector electrode 11 in a forward conducting mode including a transistor mode and an IGBT mode, if a voltage $V_C$ applied to the collector electrode 11 is higher than a voltage $V_E$ applied to the first electrode.

Each of the diode cells 120, 220 typically includes a p-type anode region in Ohmic contact with the first electrode typically forming or in Ohmic contact with a common anode emitter terminal ($V_E=V_A$). The diode cells 120, 220 inject holes into the drift region 1 in a reverse-conducting mode of semiconductor device 100 in which $V_C<V_E$. Accordingly, a bipolar current at low resistance may be generated.

The transistor cells 110, 210 may be planar-gate cells with planar gate electrodes arranged on the first surface 15 or trench-gate cells with trench electrodes extending into the semiconductor body 40. In one embodiment, the transistor cells 110, 210 and the diode cells 120, 220 are formed in different semiconductor mesas separated by trench-gate structures.

For sake of clarity, the source regions, body regions, gate electrodes, gate dielectrics and anode regions are not shown in FIG. 1.

The semiconductor device 100 is in a forward blocking mode ($V_C>V_E$) as long as the difference between the gate voltage $V_G$ and the emitter voltage $V_E$ is below a threshold voltage $V_{th}$ at which inversion channels are formed in the transistor cells 110, 210. When the difference $V_G-V_E$ exceeds the threshold voltage, the respective transistor cell 110, 210 forms an inversion channel and electrons enter into the drift region 1 through the transistor cell in a forward conducting mode.

In the forward conducting mode ($V_C > V_E$, $V_G - V_E > V_{th}$), the rc-IGBT 100 is in a transistor mode as long as the on-state current is a unipolar current based on electrons entering through the transistor channels and discharged at the backside emitter regions 5. Close to the collector regions 6, 9, the electron flow has a horizontal component which, with increasing electron current, increasingly forward biases the pn-junctions 19, 19' between the drift region 1 and the collector regions 6, 9. A resulting voltage drop at the respective pn-junction 19, 19' is the higher the longer a distance to the next backside emitter region 5 is. As the horizontal extension of the second collector region 9 is typically larger than a horizontal extension of the first collector regions 6, for example by a factor of at least about two, at least about five or even at least about 10, and due to the absence of backside emitter regions 5 in the pilot-IGBT area 152, a voltage drop across the pn-junction 19' at the second collector region 9 is higher than across the pn-junctions 19 at the first collector regions 6 in this mode. Therefore, injection of holes into the drift region 1 will start at the pn-junction 19' at high enough electron flow. The injected holes now contribute to the current through the drift region 1. With increasing current the voltage drop further increases and the hole injection spreads over increasing portions of the second collector region 9 and finally starts also at the pn-junctions 19 of the rc-IGBT area 152. The semiconductor device 100 changes into the IGBT mode with bipolar forward current through the drift region 1 and a lower on-state resistance than in the transistor mode. As the pn-junction 19' is effective as an ignition island for hole injection, the area 152 is termed pilot-IGBT area.

Due to the lower on-state resistance in the IGBT mode, rc-IGBTs are typically designed such that they switch from the transistor mode to the IGBT mode at on-state currents as low as possible. The wider the second collector region 9 is, the longer is a (horizontal) distance the electrons have to flow and the smaller is a forward electron current that suffices to trigger hole injection. Therefore, using one or more wide (not interrupted) p-type second collector regions 9 and pilot areas 152, respectively, facilitate a fast transition to the IGBT mode at low forward currents.

Typically, the charge plasma concentration during the IGBT mode is higher in the pilot-IGBT area 152 compared to the rc-IGBT area 151. This typically also applies to higher current densities, e.g. at or close to a rated current density of the semiconductor device 100. This may result in a horizontally varying temperature profile at higher forward current densities. The higher temperature in the pilot-IGBT area 152 or at least in an inner part of the pilot-IGBT area 152 may result in an increased leakage current during blocking state. This effect may be further amplified by the parasitic pnp-transistors formed by the second collector region 9, the drift region 1 and the body or anode regions.

More particular, the leakage current of an IGBT is composed of different contributions such as the electron-hole generation at generation centers in the space charge region and the hole-current from the backside p-emitters, which is generated by the gain of the parasitic pnp-transistor. A further portion, which is of particular importance at higher temperature that may occur during device operation, is the so-called diffusion current from the front side (15). This diffusion current is due to a gradient of the electron concentration formed in the forward blocking mode. In this mode, the electron concentration in the p-type regions, which are arranged next to the front side and below the n-type source regions, and directly at the metal contacts is proportional to the square of the intrinsic carrier density and thus substantially higher than the electron concentration in the space charge zone. Accordingly, there is a gradient of the electron concentration between the metal contacts and the space charge zone. The corresponding diffusion leakage current density is inversely proportional to the p-type dopant dose between the metal contacts and the space charge zone. This is similar for a diffusion leakage current below the source region. As the intrinsic carrier density increases rapidly with temperature, the contribution of the diffusion leakage current typically rises with the temperature.

According to an embodiment, a number of p-type dopants of p-type semiconductor regions above the drift region 1 (between the drift region and the first metallization and first surface 15, respectively) per horizontal area (p-type dopant dose) is higher in the pilot-IGBT area 152 compared to the rc-IGBT area 151. For the illustrated vertical cross-section this means that the number of p-type dopants of the p-type semiconductor regions divided by the horizontal extension is higher in the pilot-IGBT area 152 compared to the rc-IGBT area 151. A higher p-type dopant dose in the pilot-IGBT area 152 compared to the rc-IGBT area 151 may be implemented in several ways as explained below with regard to FIG. 3 to FIG. 14.

According to another embodiment, a number of p-type dopants of the p-type semiconductor regions above the drift region 1 (between the drift region and the first metallization and first surface 15, respectively) per horizontal area (p-type dopant dose) is only higher in an inner part of the pilot-IGBT area 152, which is spaced apart from the rc-IGBT area 151 by a border region of the pilot-IGBT area 152, compared to the rc-IGBT area 151. For example, the pilot-IGBT area 152 may include transistor cells 110 and diode cells 120 inside the border region next to the rc-IGBT area 151, and may include transistor cells 210 and/or diode cells 220 in the inner part of the pilot-IGBT area 152.

Since the contribution of the diode-cells 220 and transistor cells 210 of the pilot-IGBT area 152 is at most of minor importance for the reverse current (in the diode mode), the higher front side p-type emitter efficiency (which is due to the higher p-type dopant dose) of the pilot-IGBT area 152 has no or at most only a weak detrimental influence on the diode operation of the semiconductor device 100. On the other hand, the total diffusion leakage current (density) is efficiently reduced, namely in the pilot-IGBT area 152, where the diffusion leakage current density of a similar device but with the same p-dopant dose above the drift region 1 is typically higher in the pilot-IGBT area due to the typically higher temperatures in the pilot-IGBT area compared to the rc-IGBT area. Accordingly, the semiconductor device 100 has, in particular at higher operating temperatures, a better trade-off with regard to diode performance and leakage current compared to other rc-IGBTs.

Figure 2:
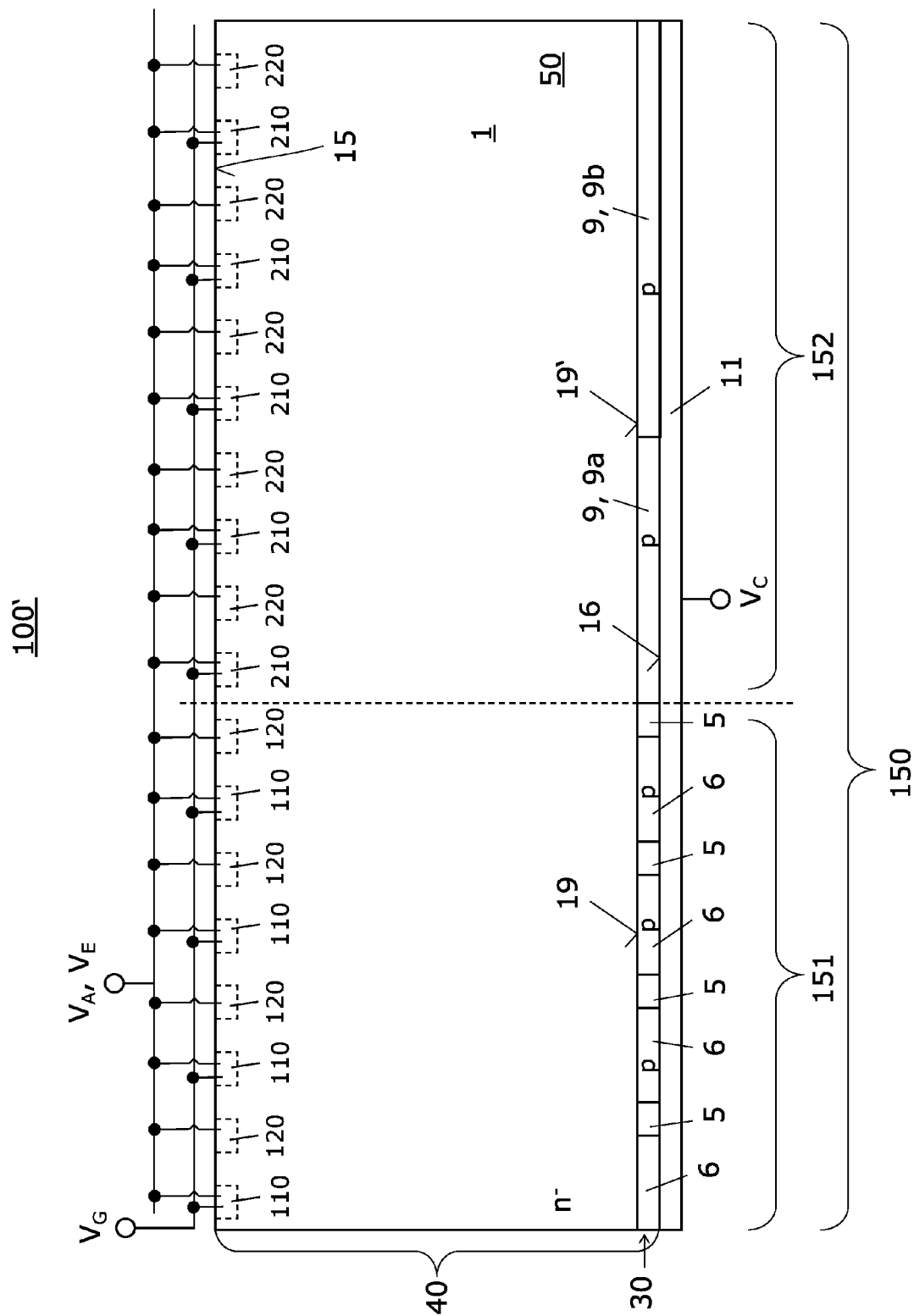
FIG. 2 schematically illustrates a vertical cross-section of a portion of a vertical semiconductor device according to one or more embodiments.

The semiconductor device 100' illustrated in FIG. 2 differs from the semiconductor device 100 illustrated in FIG. 1 in that the second collector region 9 has two p-type portions 9a, 9b of different maximum doping concentration. By using two or more p-type portions 9a, 9b of different maximum doping concentration and/or a second collector region 9 with a doping concentration that varies continuously or step-wise in a horizontal direction, the switching softness may be improved.

Figure 3:
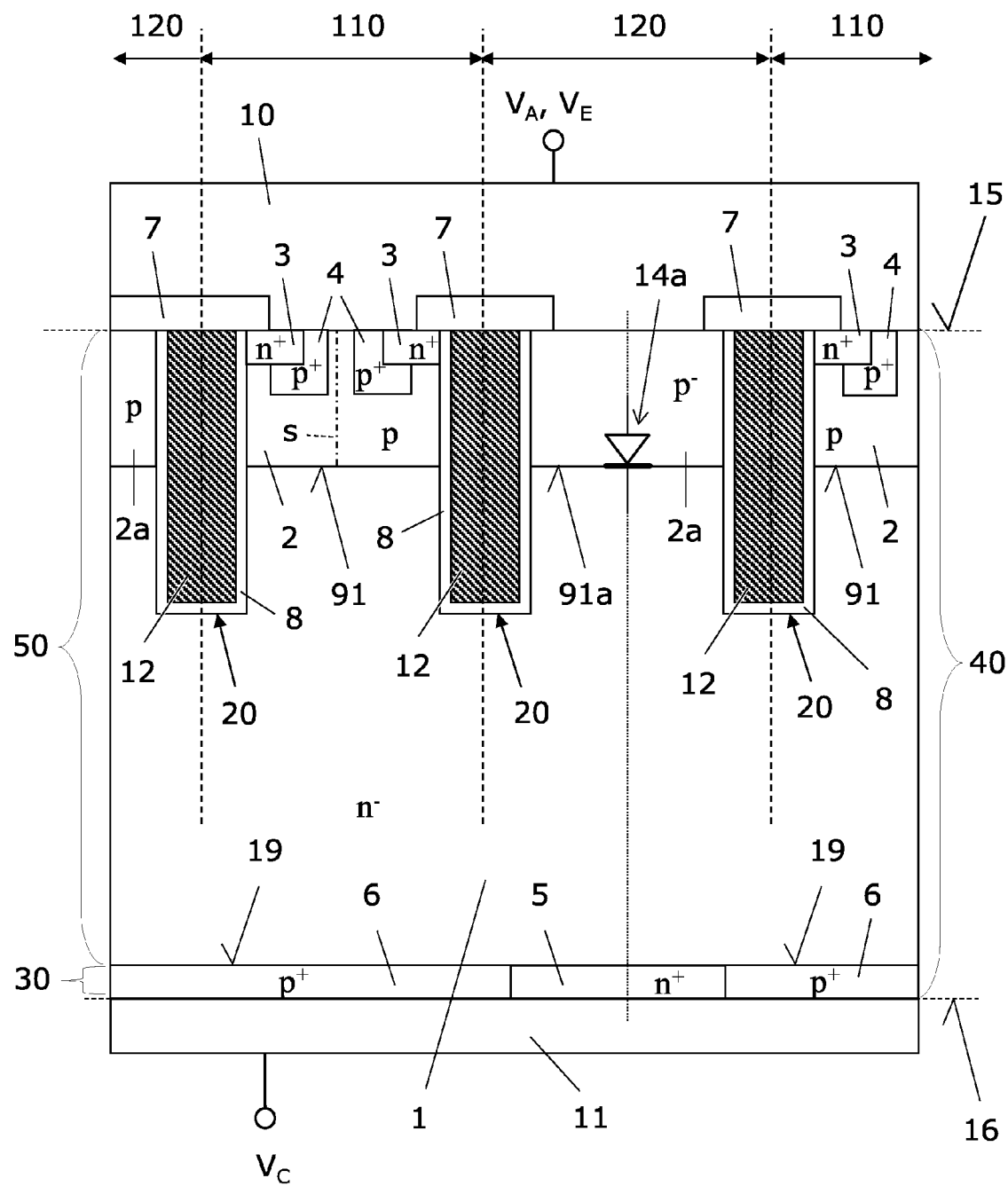
FIG. 3 schematically illustrates a vertical cross-section of a portion of a vertical semiconductor device according to one or more embodiments.
Figure 4:
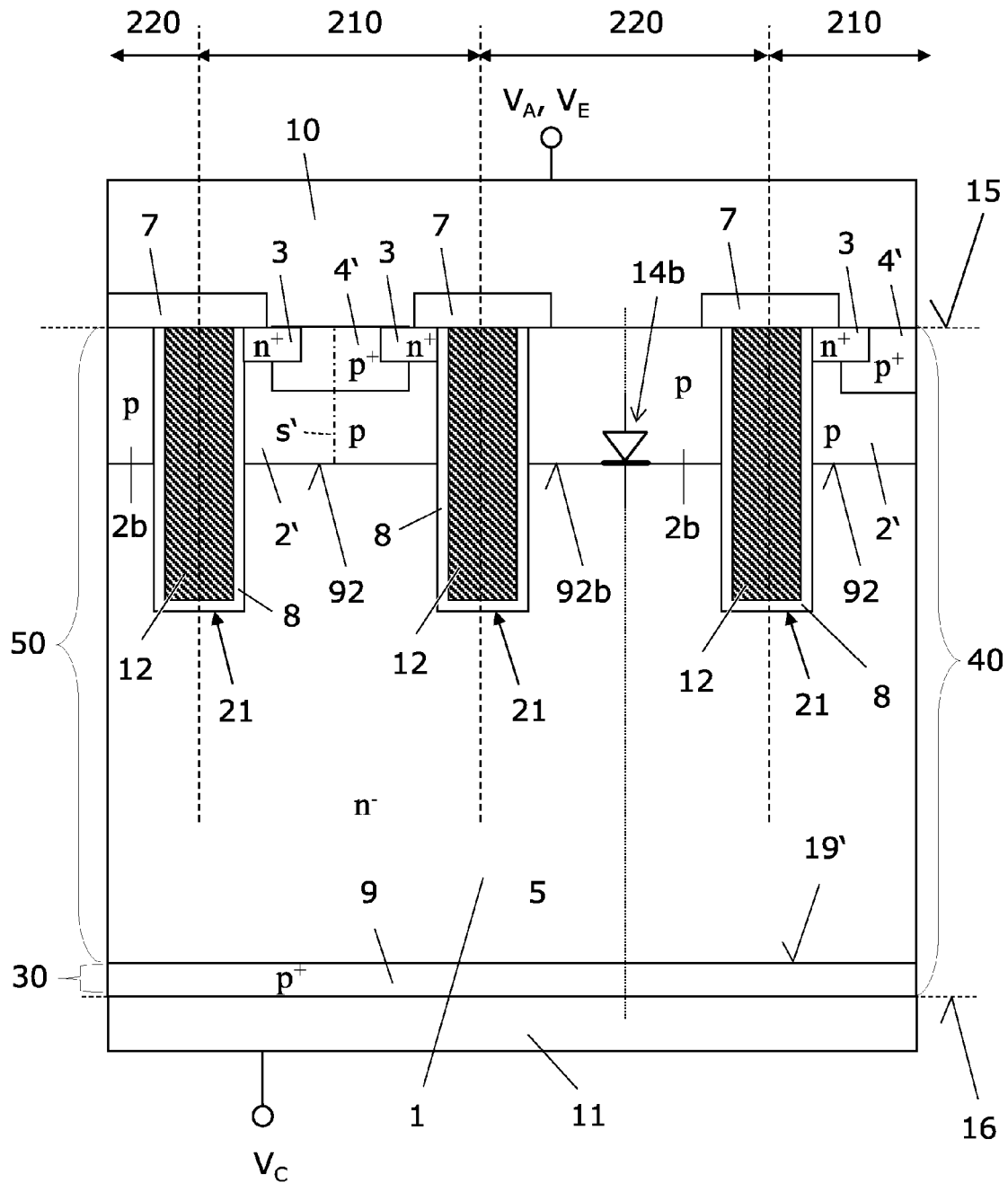
FIG. 4 schematically illustrates a vertical cross-section of another portion of the vertical semiconductor device illustrated in FIG. 3 according to one or more embodiments.

FIG. 3 schematically illustrates an embodiment of a vertical semiconductor device 200 in a section corresponding to a portion of the rc-IGBT area 151 of the semiconductor device 200. FIG. 4 schematically illustrates a section corresponding to a portion of the pilot-IGBT area 152 of the semiconductor device 200. FIG. 3 and FIG. 4 may correspond to two sections of one vertical cross-section.

The semiconductor device 200 is typically an rc-IGBT with an rc-IGBT area 151 and a pilot-IGBT area 152 as explained above with regard to FIG. 1 and FIG. 2. The semiconductor device 200 also includes a semiconductor body 40 extending between a first surface 15 and a second surface 16 opposite to the first surface, an n-type (n-conducting) drift region 1 arranged between the first surface 15 and the second surface 16, p-type first collector regions 6 arranged at the second surface 16, a p-type second collector region 9 arranged at the second surface 16, and an n-type backside emitter region 5 in Ohmic contact with the drift region 1 and arranged at the second surface 16.

In a projection onto the first surface 15, each of the first collector regions 6 overlaps with at least one of the first IGBT-cells 110 and the first diode-cells 120, the backside emitter region 5 overlaps with a first diode-cell 120, and the second collector region 9 overlaps with the second IGBT-cells 210 and the second diode-cells 220.

In other embodiments, the backside emitter region 5 overlaps at least partly with a first IGBT-cell.

Each of the IGBT-cells 110, 210 typically includes an npn-structure arranged next to the first surface 15.

In the exemplary embodiment, each of the npn-structures of the IGBT-cells 110, 120 are formed in the vertical cross-section by one or more n-type source regions 3, p-type body regions 2, 2' and the (common) drift region 1.

In the exemplary embodiment, each of the diode-cells 120, 220 includes a p-type anode region 2a, 2b arranged at the first surface 15 and forming a pn-junction 91a, 92b with the drift region 1 to implement a free-wheeling diode 14a, 14b respectively. In the following, the anode region 2a, 2b are also referred to as first anode region 2a and second anode region 2b, respectively, and the pn-junctions 91a, 92b are also referred to as second pn-junction 91a and forth pn-junction 92b, respectively.

A first electrode 10 is arranged on the first surface 15 and in Ohmic contact with the source regions 3 and the body regions 2, 2'. The first electrode 10 is typically also in Ohmic contact with the anode regions 2a, 2b. The body regions 2, 2' are typically in ohmic contact with the first electrode 10 via corresponding higher p-doped anti-latch-up regions 4, 4' to avoid latch-up of the IGBT-cells 110, 210. Typically, the maximum doping concentration of the anti-latch-up regions 4, 4' is at least ten times higher than the maximum doping concentration of the adjoining body region 2, 2'.

More particular, each of the first IGBT-cells 110 includes a p-type first anti-latch-up region 4 in ohmic contact with the first electrode 10, adjoining the first body region 2 and having a higher maximum doping concentration than the first body region 2, and each of the second IGBT-cells 210 includes a p-type second anti-latch-up region 4' in ohmic contact with the first electrode 10, adjoining the second body region 2' and having a higher maximum doping concentration than the second body region 2'. The first body region 2 forms a first pn-junction 91 with the drift region 1. The second body region 2' forms a third pn-junction 92 with the drift region 1.

In the exemplary embodiment illustrated in FIG. 3 and FIG. 4, the anti-latch-up regions 4, 4' of each IGBT-cell 110, 210 adjoin two corresponding source regions 3.

A second electrode 11 is arranged on the second surface 16 and in Ohmic contact with the first collector regions 6, the second collector region 9 and the backside emitter region 5.

In the exemplary embodiment, the IGBT-cells 110, 210 are implemented as trench IGBT-cells alternating in the vertical cross-section with diode-cells 120, 220.

As illustrated in FIG. 3, the first body region 2 and the first anode region 2a of adjacent first IGBT- and diode-cells 110, 120 may, in the vertical cross-section, be separated from each other by a first vertical trench 20 accommodating a first gate electrode 12 insulated by a gate dielectric region 8 from the semiconductor body 40 and by an insulating region 7 from the first electrode 10.

As illustrated in FIG. 4, the second body region 2' and the second anode region 2b of adjacent second IGBT- and diode-cells 210, 220 may, in the vertical cross-section, be separated from each other by a second vertical trench 21 accommodating a second gate electrode 12 insulated by a gate dielectric region 8 from the semiconductor body 40 and by an insulating region 7 from the first electrode 10.

In the exemplary embodiment, the second pn-junction 91a is spaced apart from adjacent first pn-junctions 91 by a respective first vertical trench 20, and the fourth pn-junction 92b is spaced apart from adjacent third pn-junctions 92 by a respective second vertical trench 21.

Typically, the first IGBT-cells 110 of the rc-IGBT area 151 and the second IGBT-cells 210 of the pilot-IGBT area 152 have the same first horizontal width. Likewise, the first diode-cells 210 of the rc-IGBT area 151 and the second diode-cells 220 of the pilot-IGBT area 152 have typically the same second horizontal width.

However, and as explained above with regard to FIG. 1 and FIG. 2, the number of p-dopants per horizontal area in the semiconductor body 40 and above the drift region 1 (above the pn-junctions 91, 91a, 92, 92a) and between the drift region 1 and the first surface 15 (first electrode 10) is higher in the pilot-IGBT area 152 compared to the rc-IGBT area 151.

Typically, a total number of p-type dopants per horizontal area of the second anti-latch-up region 4' and/or the second body region 2' is larger than a total number of p-type dopants per horizontal area of the first anti-latch-up region 4 and/or the first body region 2.

In the exemplary embodiment illustrated in FIG. 3 and FIG. 4, this is achieved by using in each first IGBT-cell 110 two separated portions 4 of the anti-latch-up region 4 which have a smaller total horizontal extension compared to the anti-latch-up region 4' of the second IGBT-cell(s) 210.

In this embodiment, the average doping concentration of each of the first p-type semiconductor regions 2, 2a, 4 above the drift region 1 in the rc-IGBT area 151, may substantially match an average doping concentration of a corresponding p-type second semiconductor region 2', 2b, 4' above the drift region 1 in the pilot-IGBT area 152.

This means that the average doping concentration of the first and second body regions 2, 2' may substantially match, that the average doping concentration of the first and second anti-latch-up regions 4, 4' may substantially match, and/or that the average doping concentration of the first and second anode regions 2a, 2b may substantially match as long as a total number of p-type dopants per horizontal area of the p-type first semiconductor regions 2, 2a, 4 exceeds a total number of p-type dopants per horizontal area of the p-type second semiconductor regions 2', 2b, 4 and/or as long as there is at least one second vertical path s' through a second IGBT-cell 210 (or second diode cell 220) from the drift region 1 to the first electrode 10 and the first surface 15, respectively, and a corresponding first vertical path s through a first IGBT-cell 110 (or first diode cell 120) from the drift region 1 to the first electrode 10 and the first surface 15, respectively, so that a second integral obtained by integrating the p-type doping concentration along the second path s' is larger than a first integral obtained by integrating the p-type doping concentration along the first path s. Within this specification, two vertical paths correspond to each other if one of them runs through a cell of the rc-IGBT area 151 and the other runs through an active cell of the same type (diode or IGBT) of the pilot-IGBT area 151 substantially at the same horizontal distance from a source region 3 of the respective active cell, at the same horizontal distance from a trench 20, 21 of the respective active cell and/or at a corresponding equivalent horizontal position such as the horizontal center of the respective active cell or a p-type semiconductor region next to the first surface 15 of the respective active cell.

As illustrated in FIG. 3 and FIG. 4, a number of p-type dopants per horizontal area in the first IGBT-cell(s) between the first pn-junction 91 and the first surface 15 has a first value, a number of p-type dopants per area in the first diode-cell(s) 110 between the second pn-junction 91a and the first surface 15 may have a second value which is lower than the first value (due to the p⁻-doping and to ensure a low hole emitting efficiency of the first diode cell 120), a number of p-type dopants per horizontal area in the second IGBT-cell(s) 210 between the third pn-junction 91a and the first surface 15 may have a third value higher than the second value, and a number of p-type dopants per horizontal area in the second diode-cell(s) 220 between the fourth pn-junction 92b and the first surface 15 may have a fourth value higher than the second value.

Typically, the third value is equal to or higher than the first value.

Furthermore, the fourth value is typically equal to or larger than the first value.

Figure 5:
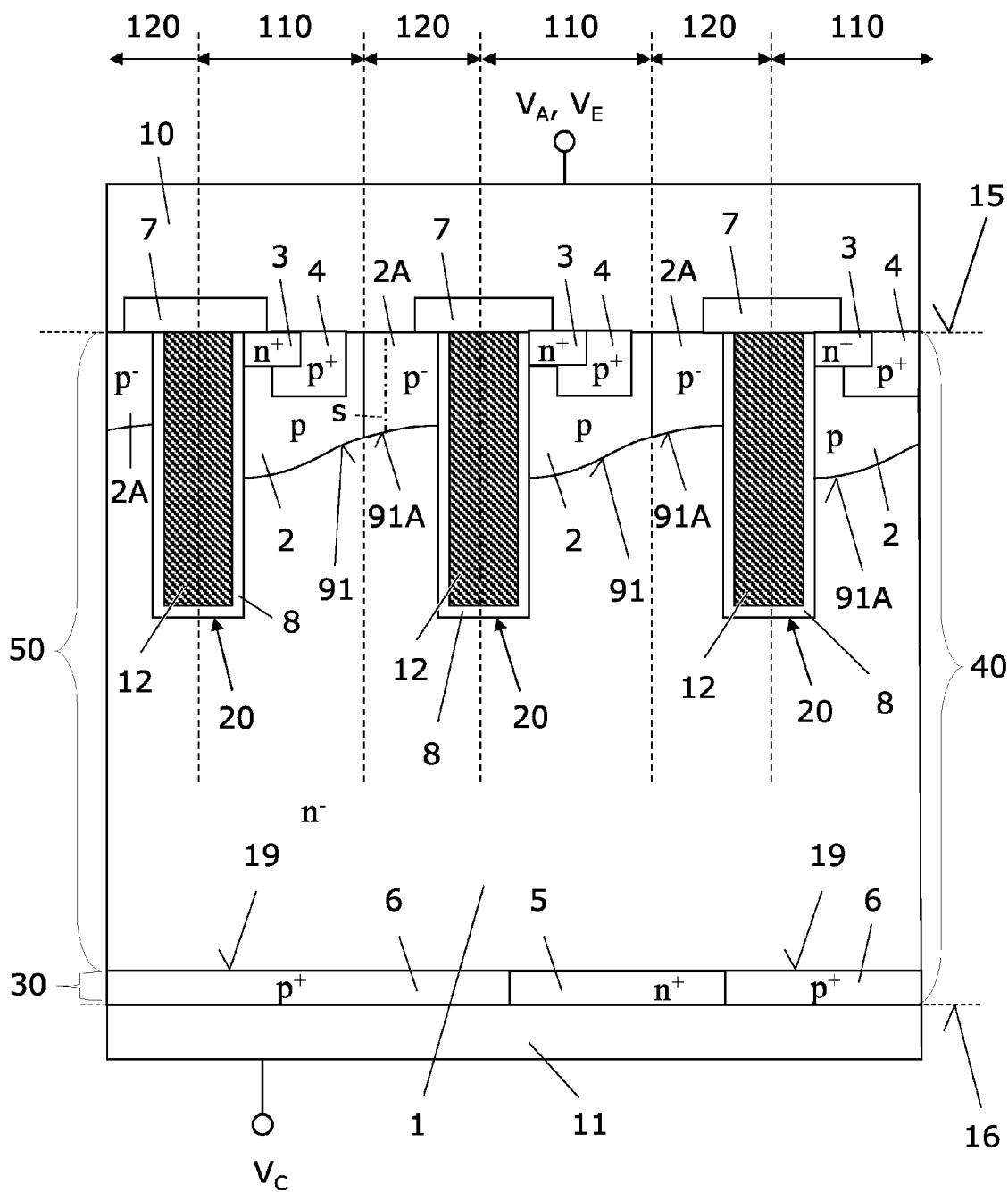
FIG. 5 schematically illustrates a vertical cross-section of a portion of a vertical semiconductor device according to one or more embodiments.
Figure 6:
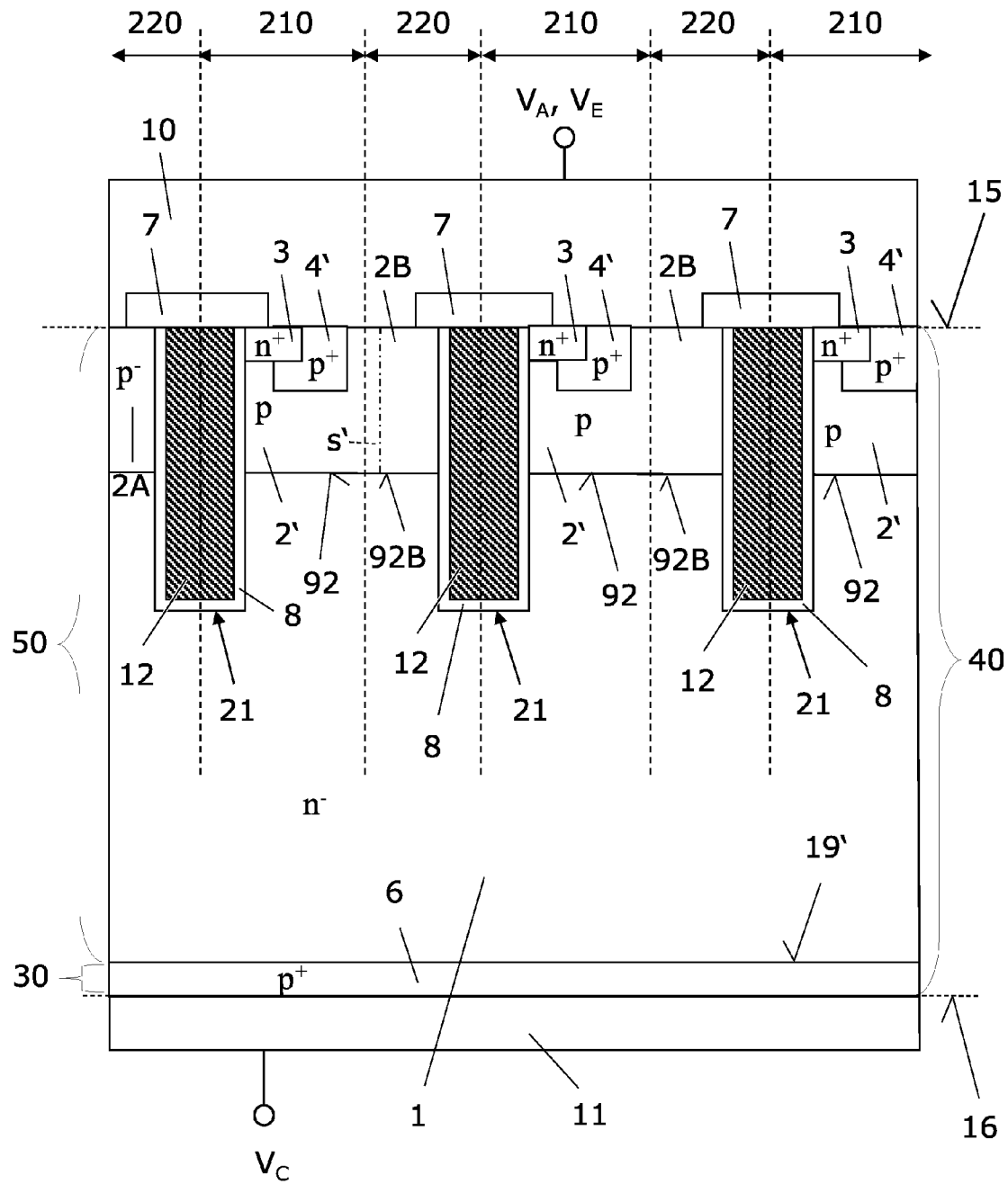
FIG. 6 schematically illustrates a vertical cross-section of another portion of the vertical semiconductor device illustrated in FIG. 5 according to one or more embodiments.

The semiconductor device 300 illustrated in FIG. 5 and FIG. 6 differs from the semiconductor device 200 explained above with regard to FIG. 3 and FIG. 4 in that the second pn-junctions 91A and the first pn-junctions 91 adjoin each other in pairs, in that the fourth pn-junctions 92B and the third pn-junctions 92 adjoin each other in pairs, and in that only one source region 3 in ohmic contact with the first electrode 10 is arranged between adjacent first vertical trenches 20 and between adjacent second vertical trenches 21.

Further, the first anode region 2A extends vertically less deep into the semiconductor body 40 than the first body region 2, the second body region 2' and the second anode region 2B. Furthermore, the maximum doping concentration of the anode region 2A may be lower than the maximum doping concentration of the body region 2. Accordingly, the hole emitting efficiency between the anode region 2A and the drift region 1 is further reduced compared to the hole emitting efficiency between the body region 2 and the drift region 1. Thus, the reverse current peak and the reverse recovery energy of the semiconductor device 300 and the switching-on energy of the first IGBT-cells 110 are reduced.

In addition, the first body region 2 typically may extend vertically less deep into the semiconductor body 40 compared to the second body region 2'. Accordingly, the first and second anti-latch-up regions 4, 4' may have the same net p-doping.

According to an embodiment, the maximum doping concentration of the body region 2 is at least fifty percent higher, more typically two times higher, and even more typically five times higher than the maximum doping concentration of the anode region 2a.

For example, the maximum doping concentration of the anti-latch-up region 4 is higher than about $10^{19}$ cm$^{-3}$, the maximum doping concentration of the body region 2 lies between about $5*10^{16}$ cm$^{-3}$ and about $5*10^{17}$ cm$^{-3}$ and the maximum doping concentration of the anode region 2A is below about $5*10^{16}$ cm$^{-3}$. The maximum doping concentration of the drift region 1 typically lies between about $5*10^{12}$ cm$^{-3}$ and about $5*10^{14}$ cm$^{-3}$, for example in the region of about $5*10^{13}$ cm$^{-3}$.

Even further, a vertical distance between the first surface 15 (or first electrode 10) and the second pn-junction 91A may be smaller than a vertical distance between the first surface 15 (or the first electrode 10) and the fourth pn-junction 92B.

The semiconductor device 300 may also be described as a reverse-conducting trench IGBT 300 with at least one first combined diode-IGBT-cell 110, 120 arranged between two neighboring trench gate electrodes 12 in the rc-IGBT area 151 and at least one second combined diode-IGBT-cell 210, 220 arranged between two neighboring trench gate electrodes 12 in the pilot-IGBT area 152 and having a higher net p-doping per horizontal area above the drift region 1 than the first combined diode-IGBT-cell 110, 120.

Figure 7:
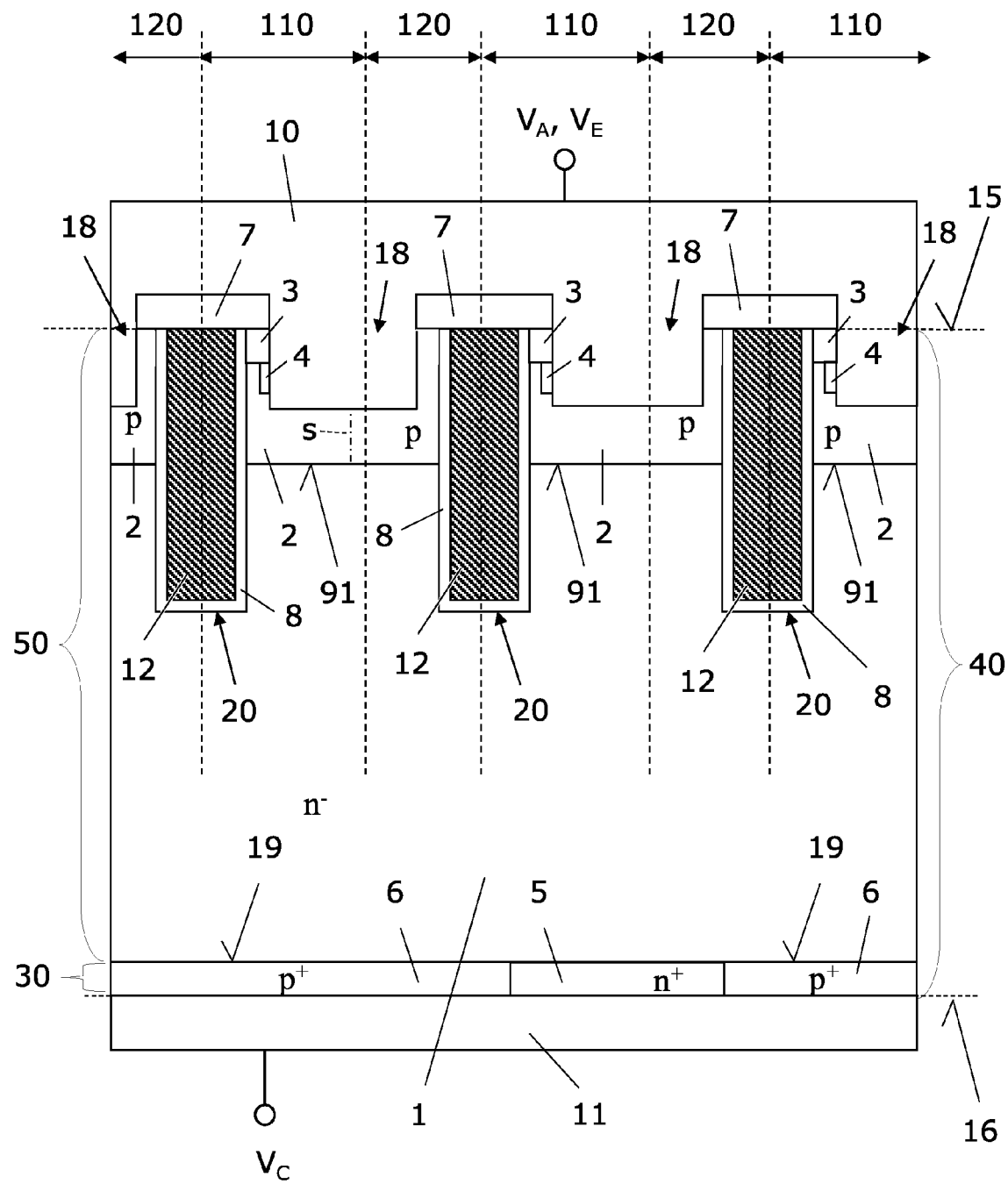
FIG. 7 schematically illustrates a vertical cross-section of a portion of a vertical semiconductor device according to one or more embodiments.
Figure 8:
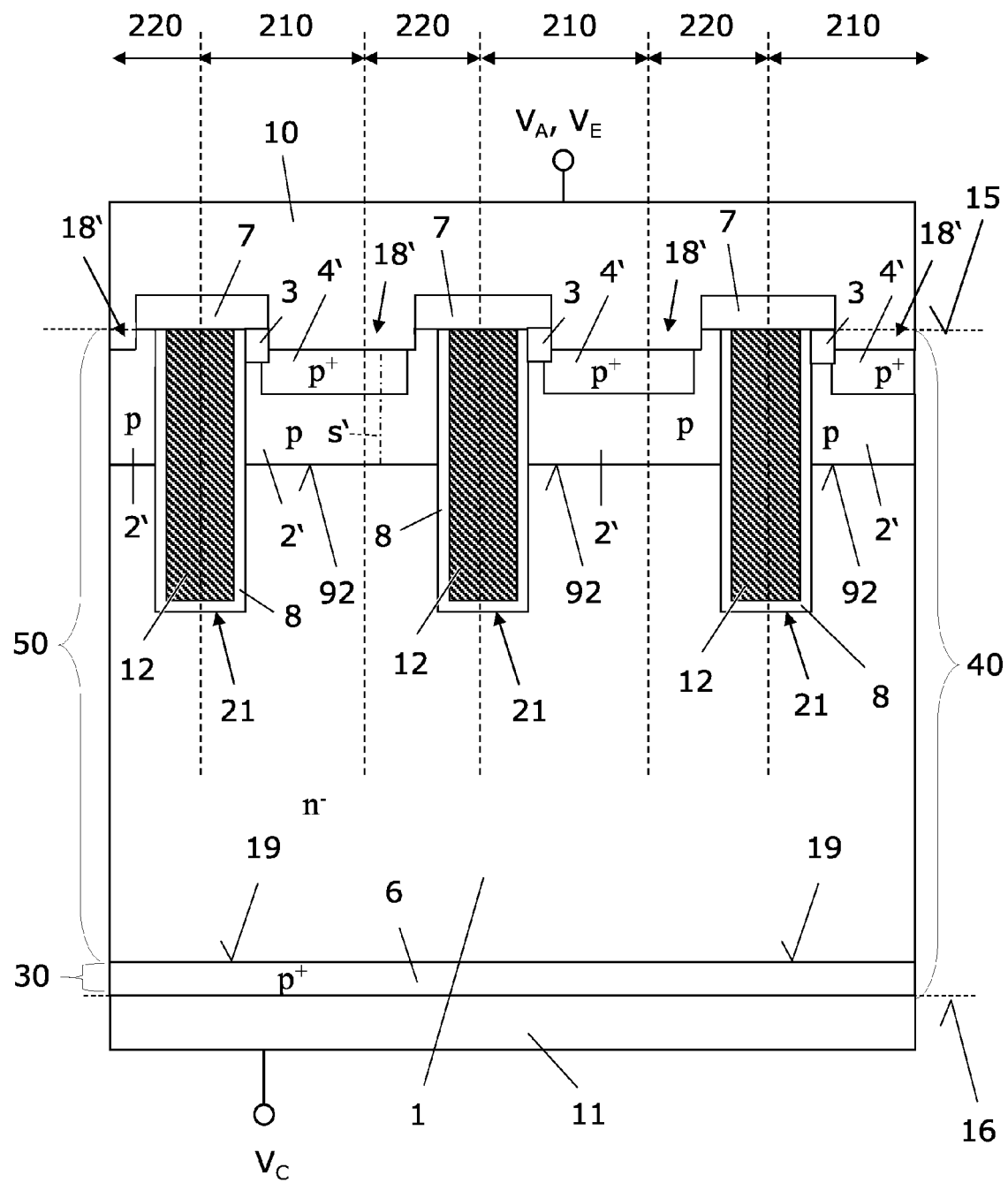
FIG. 8 schematically illustrates a vertical cross-section of another portion of the vertical semiconductor device illustrated in FIG. 7 according to one or more embodiments.

The semiconductor device 400 illustrated in FIG. 7 and FIG. 8 is similar to semiconductor device 300 explained above with regard to FIG. 5 and FIG. 6 and may also be operated as an rc-IGBT. However, the contacts between the source regions 3, the first anti-latch-up regions 4 and the second anti-latch-up regions 4' are implemented as first trench contacts 18 extending from the first surface 15 through the first anti-latch-up region 4 and into the first body region 2, and second trench contacts 18' extending from the first surface 15 only partially into the second anti-latch-up region 4', respectively.

In this embodiment, the net p-doping per horizontal area in the semiconductor body 40 above the drift region 1 is higher in the pilot-IGBT area 152 compared to the rc-IGBT area 151 even if the body regions 2, 2' have the same mean p-doping per horizontal area.

Alternatively or in addition, the first trench contacts 18 may have a larger horizontal extension (width) than the second trench contacts 18'.

Figure 9:
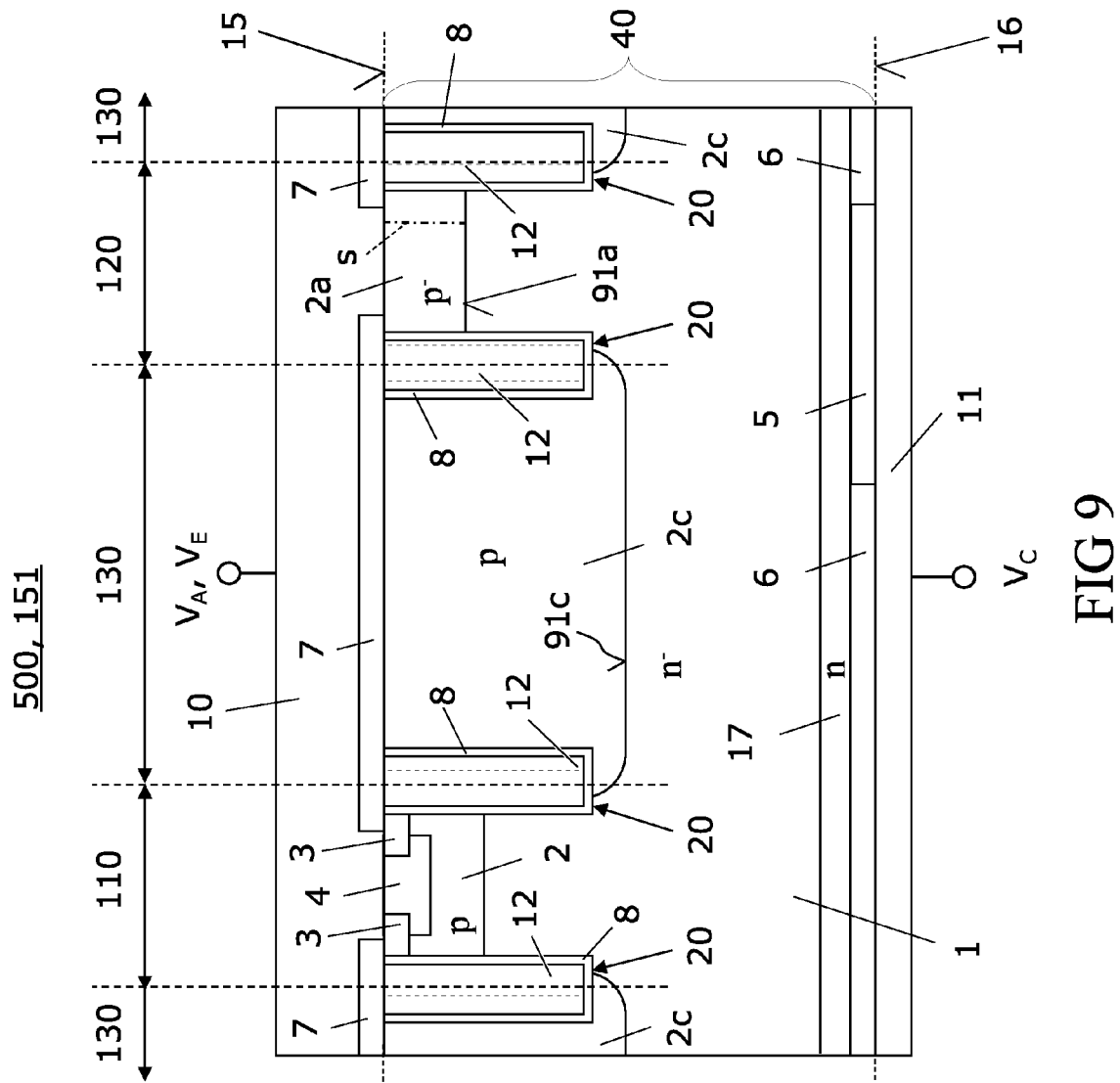
FIG. 9 schematically illustrates a vertical cross-section of a portion of a vertical semiconductor device according to one or more embodiments.
Figure 10:
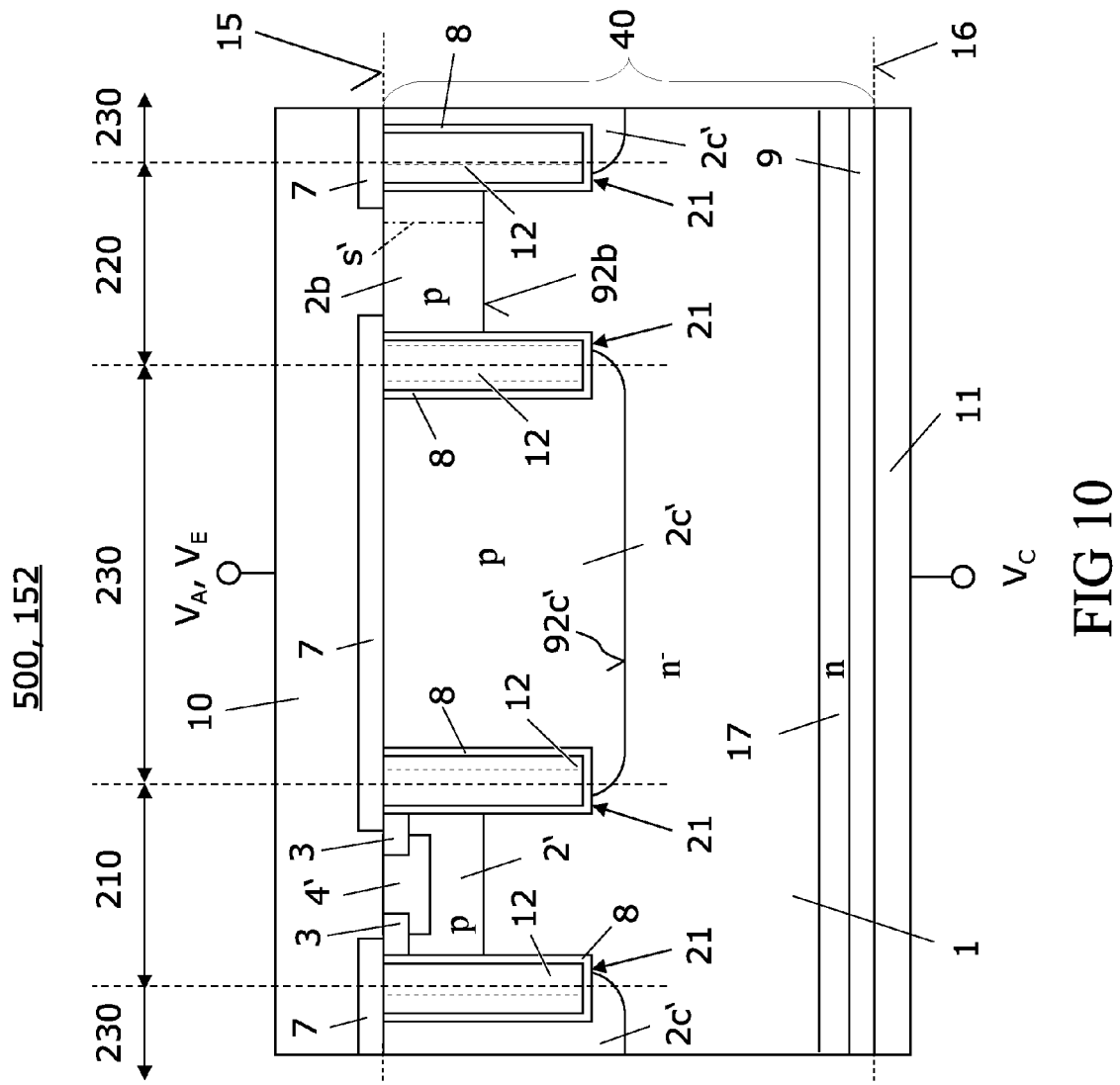
FIG. 10 schematically illustrates a vertical cross-section of another portion of the vertical semiconductor device illustrated in FIG. 9 according to one or more embodiments.

The semiconductor device 500 illustrated in FIG. 9 and FIG. 10 is similar to semiconductor device 200 explained above with regard to FIG. 3 and FIG. 4 and may also be operated as an rc-IGBT. Additionally, spacer-cells 130 with a respective p-type floating semiconductor region 2c forming a pn-junction 91c with the drift region 1 are arranged between the first IGBT-cells 110 and the first diode-cells 120 of the rc-IGBT area 151, and spacer-cells 230 with a respective p-type floating semiconductor region 2c' forming a pn-junction 92c' with the drift region 1 are arranged between the second IGBT-cells 210 and the second diode-cells 220 of the pilot-IGBT area 152. In the exemplary embodiment, the average doping concentration of the second anode region 2b is higher than the average doping concentration of the first anode region 2a. Further, the second anode region 2b may have a larger vertical extension than the first anode region 2a.

According to an embodiment, the floating semiconductor regions 2c, 2c' extend vertically deeper into the drift region 1 than the body regions 2, 2' and the anode regions 2a, 2b. The floating semiconductor regions 2c, 2c' may also extend vertically deeper into the drift region 1 than the vertical trenches 20, 21.

Figure 11:
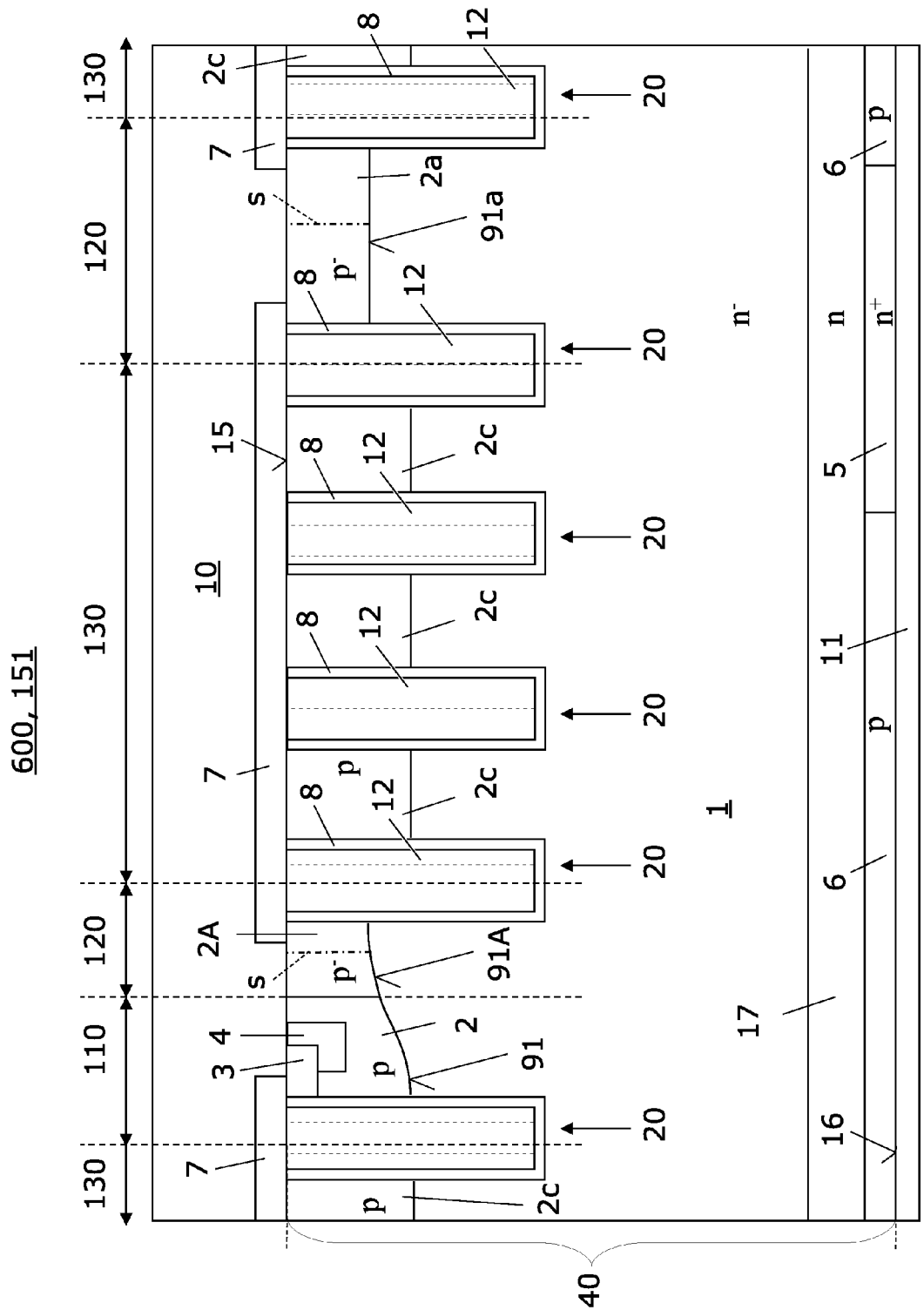
FIG. 11 schematically illustrates a vertical cross-section of a portion of a vertical semiconductor device according to one or more embodiments.
Figure 12:
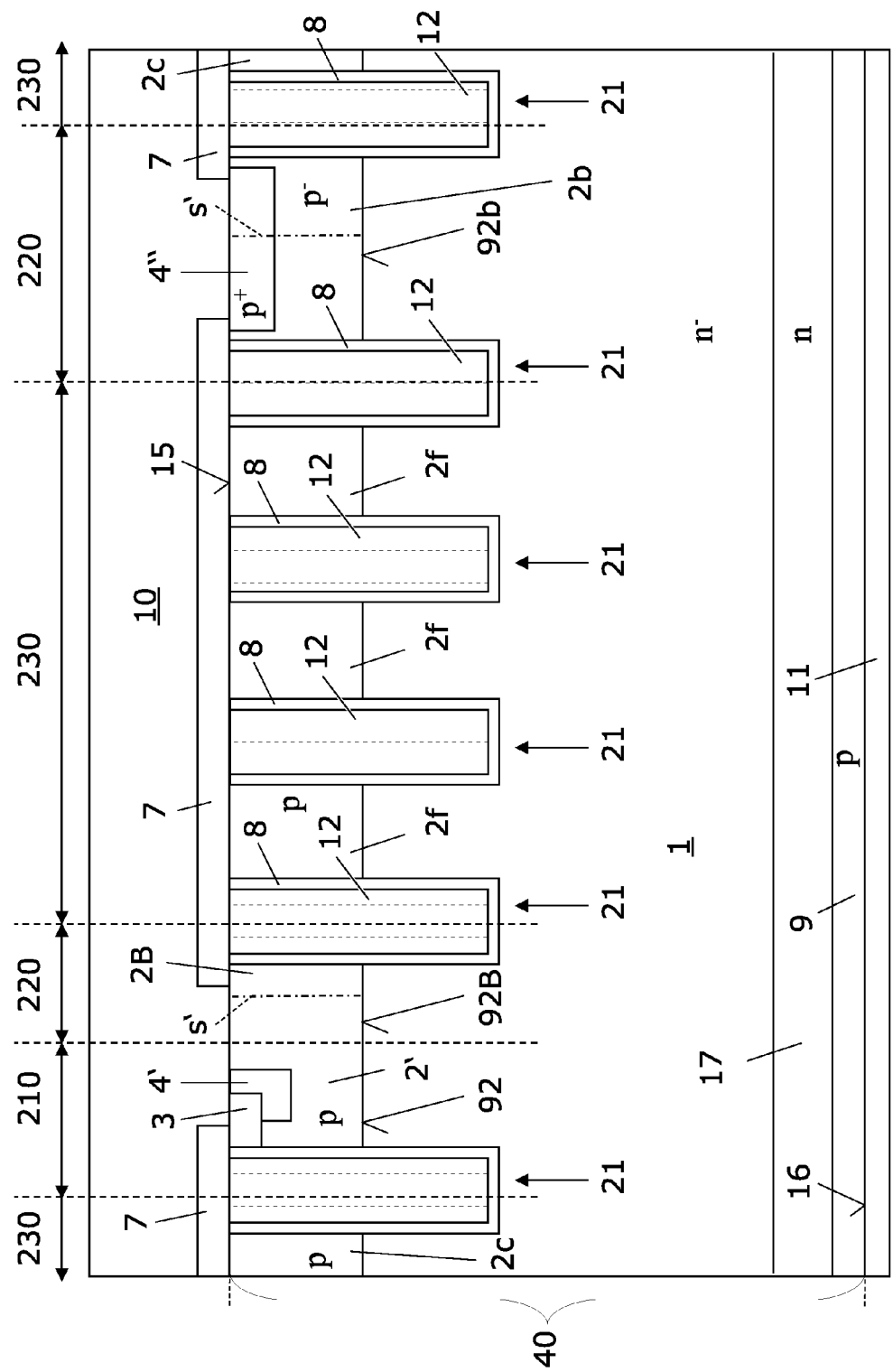
FIG. 12 schematically illustrates a vertical cross-section of another portion of the vertical semiconductor device illustrated in FIG. 11 according to one or more embodiments.

The semiconductor device 600 illustrated in FIG. 11 and FIG. 12 is similar to semiconductor device 500 explained above with regard to FIG. 9 and FIG. 10 and may also be operated as an rc-IGBT. However, the spacer-cells 130, 230 include one or more additional trenches 20, 21 between neighboring IGBT- and/or diode cells and more than one p-type floating semiconductor region 2c which do typically not extend vertically as deep into the drift region 1 as the vertical trenches 20, 21.

According to an embodiment, an n-type field-stop zone 17 is arranged between the drift region 1 and the backside n-emitter region 5 and between the base region 1 and the backside p-emitter region or collector region 6. Accordingly, the semiconductor device 600 may be operated as a reverse-conducting punch-through IGBT or field-stop IGBT. Such a field-stop zone may also be provided for the other semiconductor devices disclosed herein.

Furthermore, the second anode region 2b may be in contact with the first electrode via a higher p-doped anode contact region 4".

Figure 13:
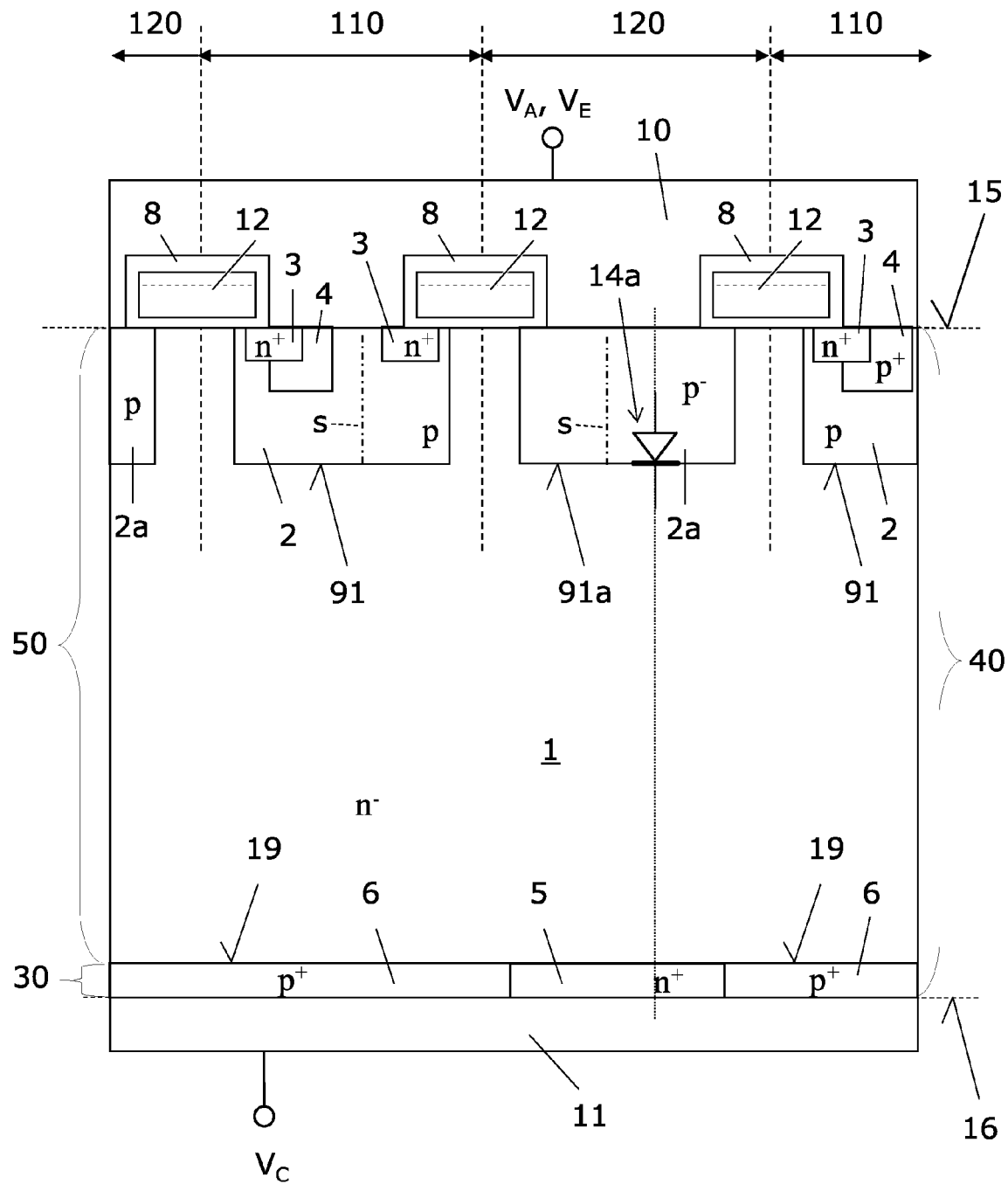
FIG. 13 schematically illustrates a vertical cross-section of a portion of a vertical semiconductor device according to one or more embodiments.
Figure 14:
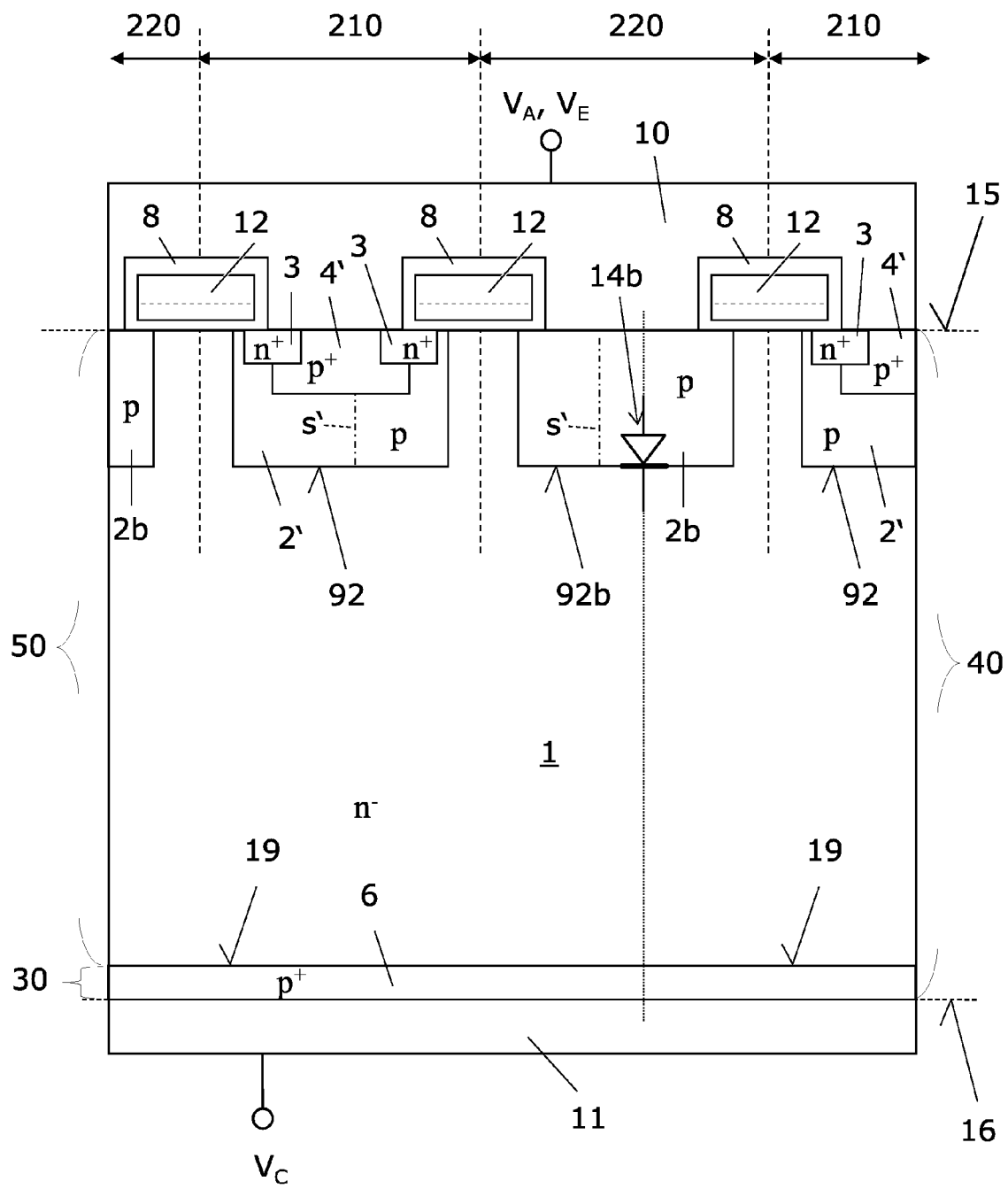
FIG. 14 schematically illustrates a vertical cross-section of another portion of the vertical semiconductor device illustrated in FIG. 13 according to one or more embodiments.

The semiconductor device 700 illustrated in FIG. 13 and FIG. 14 is similar to semiconductor device 200 explained above with regard to FIG. 3 and FIG. 4. However, the semiconductor device 700 is implemented as a planar rc-IGBT.

Accordingly, the first and second IGBT-cells 110, 210 of the semiconductor device 700 include, instead of trench gate electrodes, gate electrodes 12 insulated by respective gate dielectric regions 8 which are arranged on the main horizontal surface 15. The semiconductor device 700 may e.g. be formed as a DMOS-structure.

Spacer-cells with a p-type floating semiconductor region as explained with reference to FIG. 9 to FIG. 12 may also be used for semiconductor devices with gate electrode arranged on the main horizontal surface 15. Furthermore, doping relations and geometric properties of the semiconductor regions explained with reference to FIGS. 1 to 12 typically also apply for semiconductor devices with gate electrode arranged on main horizontal surface 15.

The bipolar reverse-conducting semiconductor devices 100 to 700 explained above have in common that a first electrode 10 is arranged on a first surface 15 and that a second electrode 11 is arranged on an opposite second surface 16 of the semiconductor body 40 which includes a drift region 1 of a first conductivity type arranged between the first surface 15 and the second surface 16, first collector regions 6 of a second conductivity type arranged at the second surface 16 and in Ohmic contact with the second electrode 11, backside emitter regions 5 of the first conductivity type arranged at the second surface 16 and in Ohmic contact with the second electrode, wherein, in a horizontal direction substantially parallel to the first surface 15, the first collector regions 5 and the backside emitter regions 6 define an rc-IGBT area 151, and a second collector region 9 of the second conductivity type arranged at the second surface 16 and in Ohmic contact with the second electrode 11. The second collector region 9 defines in the horizontal direction a pilot-IGBT area 152. The rc-IGBT area 151 includes first semiconductor regions 2, 2a, 2A, 4 of the second conductivity type in Ohmic contact with the first electrode 10 and arranged between the drift region 1 and the first electrode 10. The pilot-IGBT area 152 includes second semiconductor regions 2', 2b, 2B, 4', 4" of the second conductivity type in Ohmic contact with the first electrode 10 and arranged between the drift region 1 and the first electrode 10. A number of dopants of the second conductivity type per horizontal area of the first semiconductor regions 2, 2a, 2A, 4 is smaller than a number of dopants of the second conductivity type per horizontal area of the second semiconductor regions 2', 2b, 2B, 4', 4".

The rc-IGBT area 151 typically includes first field effect transistor cells 110 each of which comprises a first body region 2 as one of the first semiconductor regions. The first body region 2 forms a first pn-junction 91 with the drift region 1 and has a first doping concentration.

The pilot-IGBT area 152 typically includes second field effect transistor cells 210 each of which comprises a second body region 2' as one of the second semiconductor regions. The second body region 2' forms a third pn-junction 92 with the drift region 1 and has a second doping concentration that may be higher than the first doping concentration.

The rc-IGBT typically includes a first diode-cell 120 with a first anode region 2a as one of the first semiconductor regions. The first anode region 2a forms a second pn-junction 91a with the drift region 1, and has a doping concentration which is lower than the first doping concentration.

The pilot-IGBT area 152 may include a second diode-cell 220 with a second anode region 2b as one of the second p-type semiconductor regions. The second anode region 2b forms a fourth pn-junction 92b with the drift region 1 and has a doping concentration which is equal to or larger than the doping concentration of the first anode region 2a.

Figure 15:
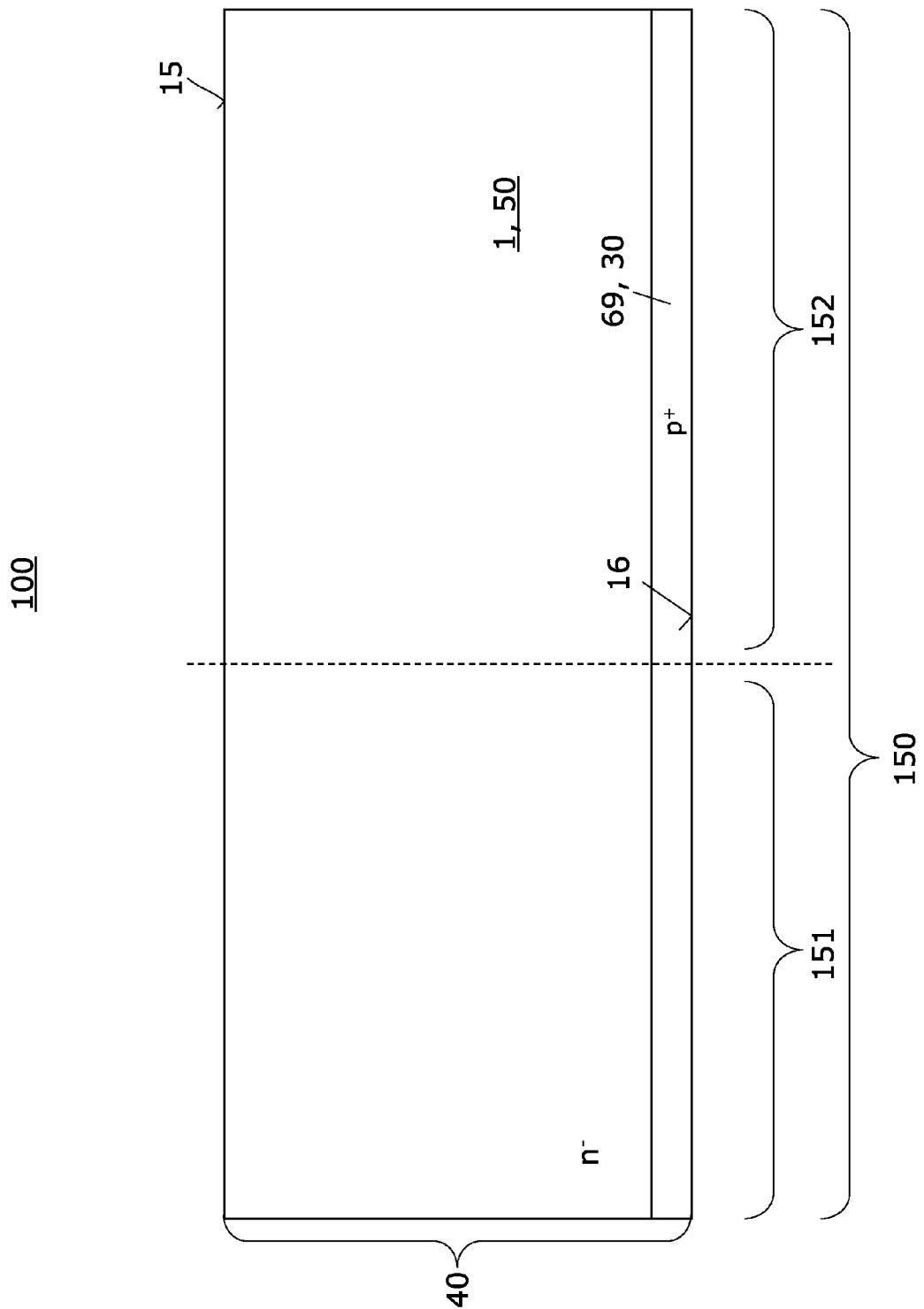
FIG. 15 and FIG. 16 schematically illustrate vertical cross-sections through a semiconductor body during method steps of a method according to embodiments.
Figure 16:
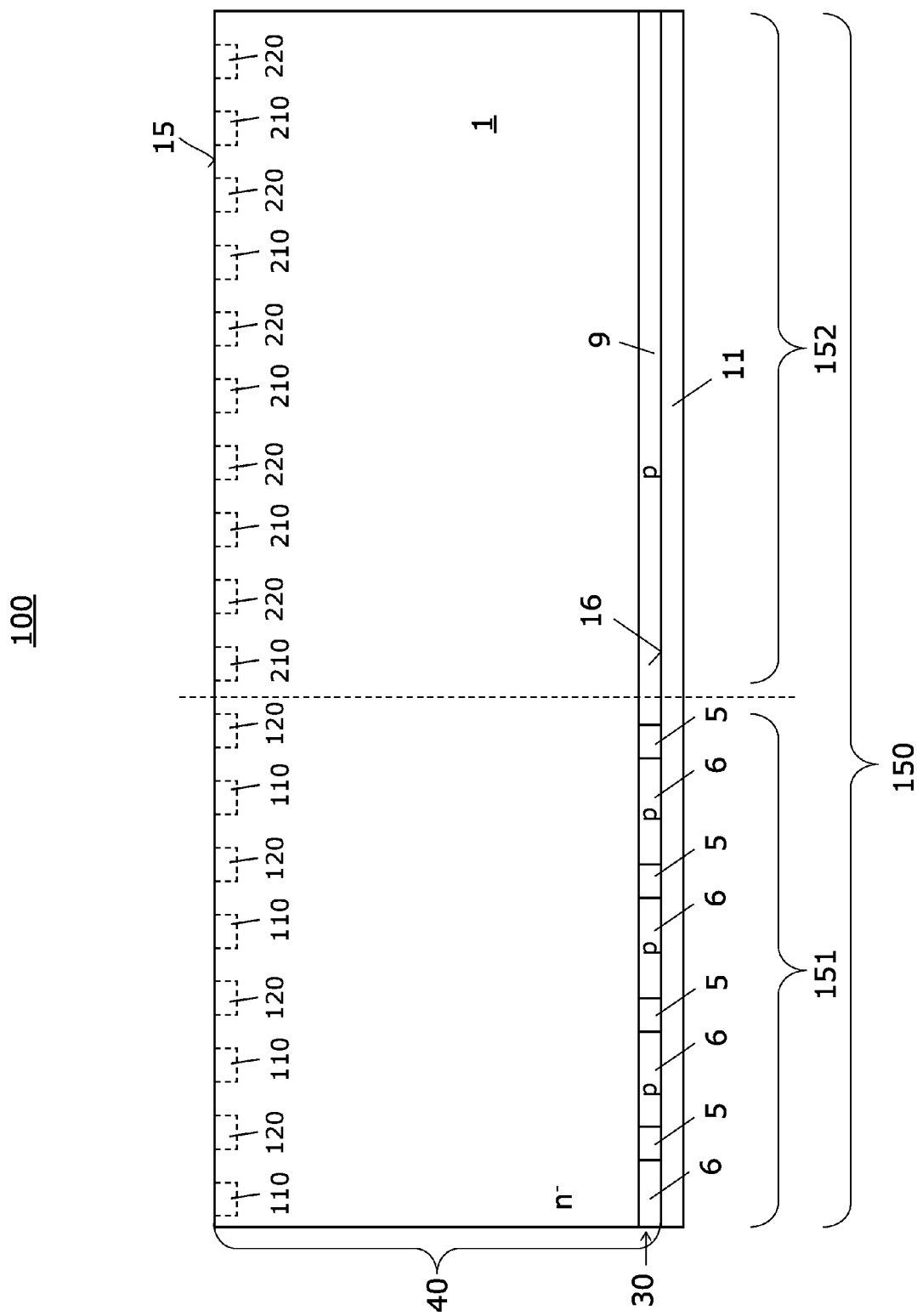

Referring to FIG. 15 and FIG. 16 method steps of a method for forming a semiconductor device 100 are explained. FIG. 15 and FIG. 16 illustrate vertical cross-sections through the semiconductor device 100 and a semiconductor body 40 of semiconductor device 100, respectively. Note that the semiconductor device 100 to be manufactured is typically a power semiconductor device with a plurality of unit cells arranged in an active area for switching and/or controlling a vertical current. Furthermore, semiconductor device 100 is typically manufactured on wafer-level. For sake of clarity, the FIG. 15 and FIG. 16 typically only represent a section through the semiconductor body or wafer 40.

In a first step, a semiconductor body 40, e.g. a monocrystalline Si-wafer, having a first surface 15 and an n-type drift layer 1 extending to the first surface 15 may be provided. The doping of the drift layer 1 may however also be adjusted later, typically by implanting of n-type dopants and a subsequent annealing.

Thereafter, a structured back-side emitter layer 30 including p-type first collector regions 6 arranged between the drift layer 1 and a second surface 16 of the semiconductor body 40 opposite to the first surface 15, n-type backside emitter regions 5 in ohmic contact with the drift layer 1 and arranged between the second surface 16 and the drift layer 1, and a p-type second collector region 9 arranged between the second surface 16 and the drift layer 1 may be formed such that, in a horizontal direction substantially parallel to the second surface 16, the first collector regions 5 and the backside emitter regions 6, which may alternate with each other, define a first device area (rc-IGBT-area) 151, and that the second collector region 9 defines in the horizontal direction a second device area (pilot-IGBT-area) 152.

As illustrated in FIG. 15, the semiconductor body 40 may be provided with a p$^+$-type bulk mono-crystalline material layer 30 forming a p-doped collector layer 69 and an n$^-$-type epitaxial layer 50 formed thereon as drift layer 1. Forming the structured back-side emitter layer 30 may include defining the first and second device areas 151, 152 and implanting n-type dopants into the layer 69 using a mask arranged at the second surface 16 having openings in the first device area 151 only. Alternatively, forming the structured back-side emitter layer 30 may include masked implantation of p-type dopants into a lower layer 30 of the drift layer 1 extending to the second surface 16.

Thereafter or prior to forming the structured back-side emitter layer 30, first IGBT-cells 110 maybe formed in the first device area 151 and second IGBT-cells 210 may be formed in the second device area 152. This typically includes introducing p-type dopants into the drift layer 1, e.g. by masked implantation using a mask on the first surface 15, to form at least first body regions forming first pn-junctions with the drift layer 1 in the first device area 151 and to form at least second body regions forming second pn-junctions with the drift layer 1 in the second device area 152. The first and second IGBT-cells 110, 210 may be formed such that more p-type dopants per area are present in the semiconductor body 40 between the drift region 1 formed by a remaining portion of the drift layer and the first surface 15 in the second device area 152 compared to the first device area 151. This is typically done such that more p-type dopants per area are present between the drift region 1 and the first surface 15 in the active cells 210, 220 of the second device area 152 compared to the active cells 110, 120 of the first device area 151.

In one embodiment, more p-type dopants per area are introduced into the second device area 152 compared to the first device area 151.

Thereafter or prior to forming the structured back-side emitter layer 30, a first electrode may be formed on the first surface 15 in ohmic contact with the first body regions and the second body regions.

Thereafter, a second electrode 11 may be formed on the second surface 16 in ohmic contact with the backside emitter regions 5, the first collector regions 6 and the second collector region 9. The resulting semiconductor device is illustrated in FIG. 16.

Typically, introducing the p-type dopants into the drift layer 1 is performed such that first anode regions 120 each of which forms a second pn-junction with the drift layer 1 are formed in the first device area 151 and that second anode regions 220 each of which forms a fourth pn-junction with the drift layer 1 are formed in the second device area 152. The first and second anode regions 120, 220 may be formed such that more p-type dopants per area are present between the drift region 1 and the first surface 15 in the second device area 152 compared to the first device area 151.

For forming a p-channel reverse-conducting IGBT, doping relations have to be reversed.

According to an embodiment of a method for forming a reverse-conducting IGBT, the method includes providing a semiconductor body 40 including a first surface 15 and a drift layer 1 extending to the first surface 15; defining a first device area 151 and a second device area 152; forming in the first device area 151 first active cells 110, 120 and in the second device area 152 second active cells 210, 220 which includes introducing dopants of a second conductivity type into the drift layer 1 to form at least first body regions 2 forming first pn-junctions 91 with the drift layer 1 in the first device area 151 and to form at least second body regions 2' forming second pn-junctions 92 with the drift layer 1 in the second device area 152; forming a first electrode 10 on the first surface 15 in ohmic contact with the first body regions 2 and the second body regions 2'; forming a structured back-side emitter layer 30, which includes first collector regions 6 of a second conductivity type arranged between the drift layer 1 and a second surface 16 of the semiconductor body 40 opposite to the first surface 15, backside emitter regions 5 of a first conductivity type in ohmic contact with the drift layer 1 and arranged between the second surface 16 and the drift layer 1, and a second collector region 9 of the second conductivity type arranged between the second surface 16 and the drift layer 1, wherein, in a horizontal projection onto the first surface 15, the first collector regions 5 and the backside emitter regions 6 are arranged in the first device area 151, and wherein the second collector region 9 is in the horizontal projection arranged in the second device area 152; and forming a second electrode 11 on the second surface 16 in ohmic contact with the backside emitter regions 5, the first collector regions 6 and the second collector region 9. The method is performed such that more p-type dopants per area are present between the drift layer 1 and the first surface 15 in the second active cells 210, 220 of the second device area 152 compared to the first active cells 110, 120 of first device area 151, that at least a part of the first active cells 110, 120 are formed as first field-effect transistor-cells 120, and that at least a part of the second active cells 210, 220 are formed as second field-effect transistor-cells 220.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A reverse-conducting IGBT, comprising:
    a semiconductor body comprising a first surface, a second surface opposite to the first surface, an n-type drift region arranged between the first surface and the second surface, a p-type first collector region arranged at the second surface, a p-type second collector region arranged at the second surface, and an n-type backside emitter region in Ohmic contact with the drift region and arranged at the second surface;
    a first electrode arranged on the first surface;
    a second electrode arranged on the second surface and in Ohmic contact with the first collector region, the second collector region and the backside emitter region;
    a first IGBT-cell comprising a first body region arranged in the semiconductor body and forming a first pn-junction with the drift region, a number of p-type dopants per area in the first IGBT-cell between the first pn-junction and the first surface having a first value;
    a first diode-cell comprising a first anode region arranged in the semiconductor body and forming a second pn-junction with the drift region, a number of p-type dopants per area in the first diode-cell between the second pn-junction and the first surface having a second value lower than the first value;
a second IGBT-cell comprising a second body region arranged in the semiconductor body and forming a third pn-junction with the drift region, a number of p-type dopants per area in the second IGBT-cell between the third pn-junction and the first surface having a third value higher than the second value; and
a second diode-cell comprising a second anode region arranged in the semiconductor body and forming a fourth pn-junction with the drift region, a number of p-type dopants per area in the second diode-cell between the fourth pn-junction and the first surface having a fourth value higher than the second value,
in a projection onto the first surface the first collector region overlapping with at least one of the first IGBT-cell and the first diode-cell, the backside emitter region overlapping with at least one of the first IGBT-cell and the first diode-cell, and the second collector region overlapping with the second IGBT-cell and the second diode-cell.

2. The reverse-conducting-IGBT of claim 1, wherein the third value is higher than the first value.

3. The reverse-conducting-IGBT of claim 1, wherein the fourth value is at least equal to the first value.

4. The reverse-conducting-IGBT of claim 1, wherein the first body region and the first anode region are in a vertical cross-section substantially orthogonal to the first surface separated from each other by at least one vertical trench comprising a gate electrode insulated by a gate dielectric region.

5. The reverse-conducting-IGBT of claim 1, wherein the second body region and the second anode region are in a vertical cross-section substantially orthogonal to the first surface separated from each other by at least one vertical trench comprising a gate electrode insulated by a gate dielectric region.

6. The reverse-conducting-IGBT of claim 1, wherein the first IGBT-cell comprises a p-type first anti-latch-up region in ohmic contact with the first electrode, adjoining the first body region and having a higher maximum doping concentration than the first body region, wherein the second IGBT-cell comprises a p-type second anti-latch-up region in ohmic contact with the first electrode, adjoining the second body region and having a higher maximum doping concentration than the second body region, and wherein a number of p-type dopants per area of the second anti-latch-up region and the second body region is larger than a number of p-type dopants per area of the first anti-latch-up region and the first body region.

7. The reverse-conducting-IGBT of claim 6, wherein the first anti-latch-up region is contacted with the first electrode via a first trench contact extending from the first surface through the first anti-latch-up region and into the first body region, and wherein the second anti-latch-up region is contacted with the first electrode via a second trench contact extending from the first surface partially into the first anti-latch-up region.

8. The reverse-conducting-IGBT of claim 1, wherein at least one of the second pn-junction is spaced apart from the first pn-junction and the fourth pn-junction is spaced apart from the third pn-junction.

9. The reverse-conducting-IGBT of claim 1, wherein a vertical distance between the first surface and the second pn-junction is smaller than a vertical distance between the first surface and the fourth pn-junction.

10. A reverse-conducting IGBT, comprising:
a semiconductor body comprising a first surface, a second surface opposite to the first surface, and a drift region of a first conductivity type arranged between the first surface and the second surface;
a first electrode arranged on the first surface; and
a second electrode arranged on the second surface,
the semiconductor body further comprising:
first collector regions of a second conductivity type arranged at the second surface and in Ohmic contact with the second electrode;
backside emitter regions of the first conductivity type arranged at the second surface and in Ohmic contact with the second electrode, wherein, in a horizontal direction substantially parallel to the first surface, the first collector regions and the backside emitter regions define an rc-IGBT area; and
a second collector region of the second conductivity type arranged at the second surface and in Ohmic contact with the second electrode, the second collector region defining in the horizontal direction a pilot-IGBT area,
the rc-IGBT area comprising first semiconductor regions of the second conductivity type in Ohmic contact with the first electrode and arranged between the drift region and the first electrode; and
the pilot-IGBT area comprising second semiconductor regions of the second conductivity type in Ohmic contact with the first electrode and arranged between the drift region and the first electrode,
wherein a number of dopants of the second conductivity type per horizontal area of the first semiconductor regions is smaller than a number of dopants of the second conductivity type per horizontal area of the second semiconductor regions.

11. The reverse-conducting IGBT of claim 10, wherein the rc-IGBT area comprises first field-effect transistor cells each of which comprises a first body region as one of the first semiconductor regions, the first body region forming a first pn-junction with the drift region and having a first doping concentration, and wherein the pilot-IGBT area comprises second field-effect transistor cells each of which comprises a second body region as one of the second semiconductor regions, the second body region forming a third pn-junction with the drift region and having a second doping concentration higher than the first doping concentration.

12. The reverse-conducting IGBT of claim 11, wherein the rc-IGBT area comprises a first diode-cell comprising a first anode region as one of the first semiconductor regions, the first anode region forming a second pn-junction with the drift region, and wherein a doping concentration of the first anode region is lower than the first doping concentration; and/or wherein the pilot-IGBT area comprises a second diode-cell comprising a second anode region as one of the second p-type semiconductor regions, the second anode region forming a fourth pn-junction with the drift region, and wherein a doping concentration of the second anode region is equal to or larger than the doping concentration of the first anode region.

13. The reverse-conducting IGBT of claim 12, wherein the doping concentration of the second anode region substantially matches the first doping concentration.

14. The reverse-conducting IGBT of claim 10, wherein a doping concentration of the second collector region varies in a horizontal direction which is substantially parallel to the first surface.

15. The reverse-conducting IGBT of claim 10, wherein a floating semiconductor region of the second conductivity type forming a pn-junction with the drift region is arranged between two first field effect transistor cells, and/or between one of the first field effect transistor cells and the first diode-cell.

16. The reverse-conducting IGBT of claim 15, wherein a further floating semiconductor region of the second conductivity type forming a pn-junction with the drift region is arranged between two second field effect transistor cells, and/or between one of the second field effect transistor cells and the second diode-cell.

17. A method for forming a reverse-conducting IGBT, the method comprising:
providing a semiconductor body comprising a first surface and a drift layer extending to the first surface;
forming a structured back-side emitter layer comprising p-type first collector regions arranged between the drift layer and a second surface of the semiconductor body opposite to the first surface, n-type backside emitter regions in ohmic contact with the drift layer and arranged between the second surface and the drift layer, and a p-type second collector region arranged between the second surface and the drift layer, wherein, in a horizontal direction substantially parallel to the first surface, the first collector regions and the backside emitter regions define a first device area, and wherein the second collector region defines in the horizontal direction a second device area;
forming first IGBT-cells in the first device area and second IGBT-cells in the second device area comprising introducing p-type dopants into the drift layer to form at least first body regions forming first pn-junctions with the drift layer in the first device area and to form at least second body regions forming second pn-junctions with the drift layer in the second device area;
forming a first electrode on the first surface in ohmic contact with the first body regions and the second body regions; and
forming a second electrode on the second surface in ohmic contact with the backside emitter regions, the first collector regions and the second collector region,
wherein the method is performed such that more p-type dopants per area are present between the drift layer and the first surface in the second device area compared to the first device area.

18. The method of claim 17, wherein providing the semiconductor body and forming the structured back-side emitter layer comprises:
providing a wafer comprising a p-doped collector layer arranged at the second surface and sandwiched between the drift layer and the second surface;
defining the first device area and the second device area; and
implanting n-type dopants into the p-doped collector layer to form the backside emitter regions in the first device area.

19. The method of claim 17, wherein introducing the p-type dopants into the drift layer is performed such that first anode regions each of which forms a second pn-junction with the drift layer are formed in the first device area, and/or that second anode regions each of which forms a fourth pn-junction with the drift layer are formed in the second device area.

20. The method of claim 17, wherein introducing the p-type dopants comprises masked implantations.

* * * * *